U.S. Patent No.: US 8,578,063 B2
Battaglia et al.
Date of Patent: Nov. 5, 2013

(54) SELF-LABELING DIGITAL STORAGE UNIT

(75) Inventors: Michael S. Battaglia, Naples, FL (US); Addison M. Fischer, Naples, FL (US); Randal J. Martin, Naples, FL (US); Steve Armfield, Naples, FL (US)

(73) Assignee: Mitsubishi Kagaku Media Co., Ltd., Tokyo (JP)

( * ) Notice: Subject to any disclaimer, the term of this patent is extended or adjusted under 35 U.S.C. 154(b) by 1364 days.

(21) Appl. No.: 10/994,271

(22) Filed: Nov. 23, 2004

(65) Prior Publication Data

US 2006/0095647 A1    May 4, 2006

Related U.S. Application Data

(60) Provisional application No. 60/602,867, filed on Aug. 20, 2004.

(51) Int. Cl.
*G06F 3/00*    (2006.01)

(52) U.S. Cl.
USPC ............................................... 710/13; 710/15

(58) Field of Classification Search
None
See application file for complete search history.

(56) References Cited

U.S. PATENT DOCUMENTS

| | | | |
|---|---|---|---|
| 4,797,542 A | 1/1989 | Hara | |
| 5,276,564 A * | 1/1994 | Hessing et al. | 360/51 |
| 5,557,596 A | 9/1996 | Gibson et al. | |
| 5,745,102 A | 4/1998 | Bloch et al. | |
| 5,986,992 A | 11/1999 | Bardmesser | |
| 6,021,408 A * | 2/2000 | Ledain et al. | 707/8 |
| 6,185,143 B1 | 2/2001 | Perner et al. | |
| 6,644,556 B2 | 11/2003 | Adelmann | |
| 7,093,049 B2 * | 8/2006 | Harada et al. | 710/303 |
| 7,478,248 B2 * | 1/2009 | Ziv et al. | 713/193 |
| 2002/0118165 A1 | 8/2002 | McGowan et al. | |
| 2003/0136849 A1 | 7/2003 | Adelmann | |
| 2003/0210898 A1 | 11/2003 | Juen et al. | |
| 2005/0027976 A1 | 2/2005 | Stephan et al. | |
| 2005/0125566 A1 | 6/2005 | Szolyga et al. | |
| 2005/0185523 A1 | 8/2005 | Chen et al. | |
| 2005/0193188 A1 * | 9/2005 | Huang | 713/1 |
| 2005/0228963 A1 * | 10/2005 | Rothman et al. | 711/170 |

FOREIGN PATENT DOCUMENTS

| | | |
|---|---|---|
| EP | 0 860 982 A2 | 8/1998 |
| EP | 0 974 975 A1 | 1/2000 |
| JP | 09-050502 | 2/1997 |
| WO | WO 01/09827 A1 | 2/2001 |

OTHER PUBLICATIONS

Supplementary European Search Report, issued Dec. 1, 2011, in Application No. 05779603.9-1247/18110116 PCT/US2005028094.

(Continued)

*Primary Examiner* — Idriss N Alrobaye
*Assistant Examiner* — Dayton Lewis-Taylor
(74) *Attorney, Agent, or Firm* — Oblon, Spivak, McClelland, Maier & Neustadt, L.L.P.

(57) ABSTRACT

Portable storage units are equipped with human readable electronic displays that contain information pertaining to the content and state of the storage units. The information displayed changes as the contents of the storage unit change. Such electronic labels can contain a variety of useful information. Some information would be static, such as owner identification, while other information will be dynamic such as the amount of free space. Still other information will be browseable such as the directory structure, file contents, storage unit total capacity, storage unit available space, storage unit directory structure, storage unit file names. storage unit file contents and device reliability statistics.

38 Claims, 15 Drawing Sheets

(56) References Cited

OTHER PUBLICATIONS

Wikipedia, "Magnetoresistive Random Access Memory", retrieved Dec. 2, 2008, pp. 1-8.

Wikipedia, "Dual in-line Package", retrieved Dec. 2, 2008, pp. 1-3.
Wikipedia, "Memory Card", retrieved Dec. 2, 2008, pp. 1-5.
Wikipedia, "Flash Memory", retrieved Dec. 2, 2008, pp. 1-15.

* cited by examiner

SELF-LABELING DIGITAL STORAGE UNIT

CROSS-REFERENCES TO RELATED APPLICATIONS

This application claims the benefit of Provisional Application No. 60/602,867, filed Aug. 20, 2004, the entire content of which is hereby incorporated by reference in this application.

FIELD OF THE INVENTION

This invention generally relates to portable digital storage devices which may be operatively coupled to a host computer. More particularly, the invention relates to apparatus and methodology for equipping such storage units with self-labeling, human readable electronic displays that contain information pertaining to the content and state of the storage units. The information displayed changes as the contents and state of the storage unit changes.

BACKGROUND AND SUMMARY OF THE INVENTION

As more and more information is stored as digital data, the amount of storage capacity increases accordingly. While much data is stored "online", so as to be immediately accessible, there is also much that is stored "offline". This often includes information which has been backed-up or which has been archived. Much of this offline storage is done on passive media, such as "floppy" disks, Compact Disks (CD-ROM), tape or writable Digital Versatile Disks (DVD).

However there is also a trend to storing much information on "removable" devices—such as hard disks and "flash drives" which can be easily attached and detached to computers (the "host") via USB, FireWire, PCMCIA, Ethernet, or other means. This allows storage which is usually offline to be actively placed online quickly. Removable hard drives typically provide more aggregate storage than is presently available on CDs, or even DVDs.

Flash drives are typically smaller, but their convenience and small size makes them well suited for many applications. They are especially well suited for transporting information between work and home. Some flash drives are coupled with music players such as MP3 players, allowing stored music to be easily taken everywhere in addition to providing file portability. The most common implementation of current flash drives is with the use of the USB interface where the device connects directly to a USB port and no cable is required.

Another form of removable media that is in wide use today is flash media. Typical uses of solid state flash media include removable storage of images from digital cameras and removable music storage in portable music players. For example, a digital camera owner that possesses multiple CompactFlash modules for her/his digital camera frequently has trouble determining which media is available for use and which contain valuable pictures. Flash media is commonly accessed through external USB-attached flash media readers or via media readers integrated directly into personal computers, cameras, music players and printers.

Removable storage can be accessed, possibly modified, and then taken offline. Having such removable storage affords several benefits. It behaves like standard storage while it is online, but has the additional advantages of being stored offline (when it is not required) to reduce the chance of damage from network security breaches and can be sequestered securely to mitigate information loss from fire, theft or other physical threats. Another major benefit of removable storage is its portability. Removable storage can be loaded at work, taken home and updated by an office worker "burning the midnight oil" in the evening and brought back to work the next morning.

Increasing use of removable storage by individuals and corporations leads to "inventory" problems, especially in managing substantial numbers of such removable media; such problems as distinguishing units from one another; determining the ownership of a found device, determining which of several units has the most available capacity, or which has sufficient capacity to store a specific amount of new data.

While there are certainly disciplines to implement such management, existing solutions require manual action on the part of the user. For example the user could label each removable device. The label could include the information such as the contents of the media, its owner, and the last time it was changed. Such an approach requires discipline on the part of the user, many of whom lack the motivation and/or presence of mind to maintain such a system.

A significant feature of the exemplary embodiments of this invention is to provide a convenient and innovative way to facilitate such management, to improve its accuracy by reducing human error in labeling removable devices, and to provide, as part of an automatically generated human-readable label, useful dynamic information regarding the contents and available capacity of the removable storage device. The exemplary embodiments advantageously simplify management of storage resources by eliminating the need for manual labeling.

The illustrative embodiments of the present invention include storage units equipped with human readable electronic displays that contain information pertaining to the content of the storage units. The information displayed changes as the contents of the storage unit changes.

These electronic labels can contain a wide variety of useful information. Some information will be static, such as owner identification, while other information will be dynamic such as the amount of free space. Still other information will be browseable such as the directory structure and even file contents. The following is a partial list of contemplated content in accordance with one or more illustrative embodiments:

Storage unit total capacity
Storage unit available space
Storage unit directory structure
Storage unit file names
Storage unit file contents
Device reliability statistics
   Hours of use
   Error rate
   Total number of errors
   Device internal temperature
   Device fragmentation state
Owner contact information
   Company
   Department
   Name
   Address
   Phone
   Email address
Security status of content—could be useful for controlling what can be taken from a secured area. Software would be included which would control access using this information.
Instructions for return of found property.

DETAILED DESCRIPTION OF THE INVENTION

Figure 1A:
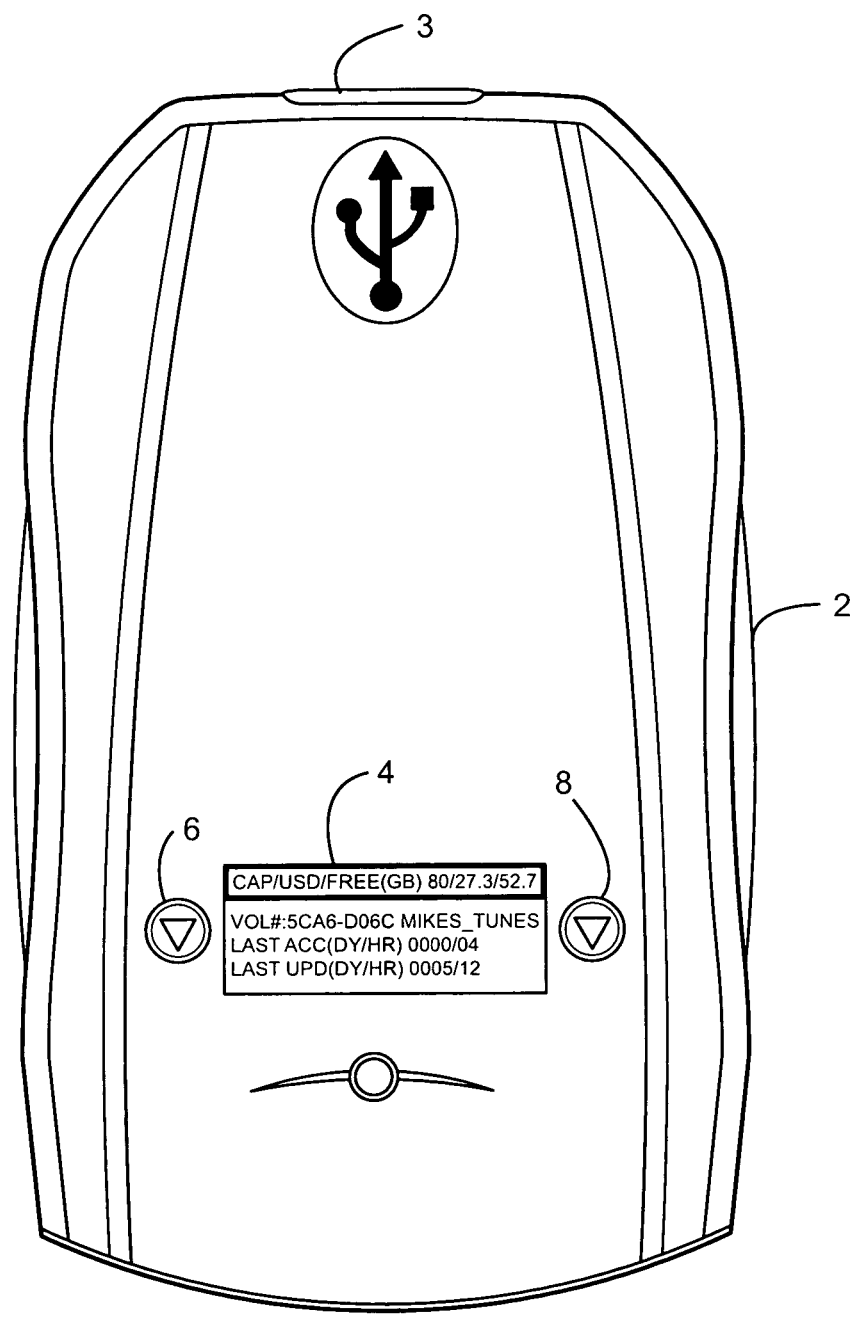
FIG. 1A is an illustrative embodiment of the present invention depicting a hard drive having a self-labeling display.

Prior to describing the exemplary embodiments in detail, it should be understood that a wide range of implementations are contemplated. For example, a wide range of types of storage devices are contemplated for use in an exemplary embodiment. The benefits for removable storage devices are clear, particularly those whose status can be easily ascertained by looking at the electronic label.

The following is a partial list of removable devices contemplated for use with one or more illustrative embodiments.

Smart cards—smart cards can benefit greatly from this technology. A significant portion of a smart card is currently unused space. Some of such unused space is converted to, for example, a persistent display that can contain information about the ownership and use of the card as well as status information. For example, an e-cash smart card could display the current balance it contains, and even information about the locations of the nearest compatible ATMs. This information can then be updated automatically, the first time a card is used in a new location.

Removable hard drives—USB, FireWire, PCMCIA and other connection mechanisms currently in existence or interfaces which are developed in the future.

Microdrives—drives using the CompactFlash form factor and interface, as well as other interfaces.

Flash drives—portable electronic storage devices that can easily be carried in a pocket that, for example, contain 256 Mbytes of storage.

Portable music players—music players contain a storage device to store music and often space for storage of other files.

Cell phones, smart phones and personal digital assistants—all these devices contain one or more types of storage that can benefit from this technology.

Flash media—CompactFlash, Memory Stick, Secure Digital Card (SD Card), MultiMediaCard (MMC), SmartMedia. Such solid state memory devices are typically used with digital appliances such as digital cameras, a wide range of computers, printers, etc. Even for the smallest of these devices, it is contemplated that display technology will evolve such that they may be used in an exemplary embodiment.

Non-removable hard drives—computer internal hard drives may benefit from this technology.

Drive arrays—drive arrays and other configurations of hard drives can benefit as well. These configurations are often used in servers and other applications where a large volume of reliable storage is required. For example, RAID Arrays of hard drives are often configured with built in redundancy so that if a drive fails, data is not lost. In such configurations, an illustrative embodiment could be used to display drive reliability and error statistics so that a physical review of the drive array can quickly identify drives that require attention.

Specialized Drivers

To interface a hard drive or hard drive emulating device such as a flash drive to an operating system, a device driver is required. Most modern USB storage devices are compatible with the USB Mass Storage Class Specification. And most modern FireWire storage devices are compatible with the FireWire Serial Bus Protocol 2. Similarly, SCSI devices and ATA (EDI) devices follow their respective standards. All of these devices are supported by most modern operating systems using drivers provided with the operating systems. Other communications channel technologies will likely require drivers to support their use as disk drive work alikes.

While many of these illustrative embodiments are designed to not require additional driver support and any other software additions or changes to a host system—there are also embodiments in which at least some of the information displayed in the external display is downloaded from the host.

In some cases it may be easier or more cost effective to implement external drivers than embodiments contained entirely within the device. However, this approach creates additional logistical considerations for the user since the software must be installed and present on the host system. Since methodology to collect information on the host is well understood by those skilled in the art, as is the writing of specialized system device and filter drivers (used to transmit such information to the storage device); and since, furthermore, this is felt to be a less preferable embodiment, the description of how this would be done would be apparent to anyone skilled in the art and will not be described herein to avoid obfuscating the present invention. However, such implementations, although arguably inferior to the illustrative embodiments, are viewed as being within the scope of this invention. Since the description herein of the information that is displayed on the label-display is intended to only be exemplary and not exhaustive, there may be applications in which the information is most conveniently extracted through the host and transmitted for display using a special protocol.

There are, however, certain novel aspects of one or more illustrative embodiments using host software that are worthy of more detailed description:

Quasi-Drivers

One of the features of most of the embodiments described thus far is to make all of the logic supporting such embodiments contained as much as possible within the storage device itself—thus minimizing or eliminating the need for specialized software on the host. However there are some desirable features that are probably most easily and economically implemented with special software running on the host, where the host may be regarded as the computer to which the storage device is attached. Other hosts are also contemplated, such as game machines and special purpose machines that have the ability to use removable storage drives.

In one such feature, users supply their own comment or description to be shown on the storage unit's display screen. Presumably such information augments and is complementary to whatever other information is automatically collected for display on the storage unit, e.g., the volume serial number, the current remaining capacity, etc.—although it would be within the scope of this invention even if this were not the case. For example, the user may wish to add a note describing the overall content in some way meaningful beyond the information automatically collected—such as "Digital photos from our vacation to the mountains with Aunt Alice and Uncle Bob."

Certainly a special device driver could be supplied which communicates using a special, or augmented, protocol to set messages for the display. However this would require special software for each of the various systems, and managing these specialized drivers would likely create complications for both the manufacturer (to create and provide) and the user (to install and maintain).

One way of solving this problem without requiring specialized system-level software is by using a protocol that can be supported by any standard application program. One example of this novel approach operates as follows: A simple utility is provided that collects the user's commentary. That commentary is then embedded in, or prefixed with, a special "escape" sequence of data. This data is written into a sector (say by being the first data of a new file). For example, this escape sequence may simply be a static collection of "random" data known to both the user program and the storage unit.

The escape sequence is recognized by special logic within the storage unit which monitors all data being written. In this embodiment, once the escape sequence is recognized, as a protocol signature, the protocol message will be acted upon by the device logic. Given a long enough selection of "random" escape sequence, it is possible to reduce the chance of such data otherwise occurring as infinitesimal. For example, with 128 bytes, the chances of such data "naturally" occurring are about 1 in $10^{308}$.

In this way any number of "protocol" messages can be defined. Each will be prefixed with the protocol signature.

However, once it is written as a file, it is possible that it will eventually be copied or moved as part of a more massive wholesale data reorganization or backup. If the data were to be copied or restored to the same unit, or to another storage unit recognizing this protocol, there would be unintended side effects.

To solve this potential problem the protocol logic could alter the protocol signature as it was received and before it is written. That way the protocol signature will not actually be recorded, and therefore is not acted upon if copied or restored.

In embodiments where it is not feasible or undesirable to alter the data as it is written, the protocol can be augmented to require two writes to the same sector with slightly different protocol signatures, within a specific time window. The first time the special sector is written, the protocol logic can set a flag indicating that a protocol operation may be in progress. Meanwhile, the write operation will be allowed to succeed. In the unlikely event that the write was legitimate the drive contents will be unaffected. If, within the time window, the same sector is re-written with the second protocol signature, the protocol logic can then accept the protocol message and act upon it. The sector could either be blocked or allowed to write, as suits the implementer. It is essentially the occurrence of dual writes with expected variation that would trigger the recognition. This prevents someone from intentional or unintentionally creating a file that would improperly affect the storage device.

A wide range of protocol messages can be constructed. The following is an exemplary list of messages.

Set the user configurable display message
Clear the user configurable display message
Perform a self test and display the results
Initialize the device to a virgin state (useful for manufacturing)
Initialize internal device storage to the data in the following sectors (useful for a utility that would re-initialize device storage after a failure, a battery replacement or at other times.)

An advantage of any of such innovative "quasi"-driver protocols described above is that they could be implemented by programs that do not require system authority or special installation consideration, and can be implemented independent of any operating system, e.g., by Java.

It is contemplated that other protocols could be used beyond what is disclosed above. In one embodiment a USB device would use the Vendor Specific Request mechanism of the USB 2.0 Specification to provide equivalent functionality.

Online Power Sources

In general, illustrative implementations are expected to require and to be supplied power while operating in their role as a host storage device while "online". One source of online power would be to draw power from the communications channel. A person of ordinary skill in the art is aware that USB and FireWire interfaces are designed to allow connected devices to draw power directly from the channel. There will be times when an auxiliary power source may be required. For example, mini USB 4-pin and mini FireWire 4-pin connectors such as those found in some laptop computers do not provide power. Similarly IRDA and WiFi communications are through the air. There is no opportunity for them to provide power. To support these scenarios an external power source, such as an AC adapter, or battery will be required while the device is online.

Embodiments Requiring Constant Offline Power

There are a number of illustrative embodiments that require a constant source of power, such as batteries. For example, implementations with clocks would need power to drive the clock even while the device is dormant and "on the shelf". Other implementations may use memory requiring constant power to maintain its contents. While yet other implementations may utilize displays requiring power to sustain an image, some are designed to show their image constantly, while others will display the image only when activated by the user.

One preferred embodiment uses a rechargeable battery—one in which a charge would be long lasting (perhaps years), but is recharged whenever the device is attached to power.

Other embodiments, for reasons of economy, might use a non-rechargeable battery with an expected life of many years—even a decade or more. This might be done with the intent that the user changes the battery after this long period; or the embodiment could use a fixed non-rechargeable battery under the assumption that the battery will outlast the anticipated service life of the storage device. Properly designed, the absence of battery power would not harm the stored data, but merely render the label feature of this invention (and its intended convenience) inoperative.

Embodiments Requiring Offline Power Only at Time of Display

Implementations are contemplated so that offline power is provided only when the user wants to observe the display "label". In this case, the information to be displayed can be maintained in non-volatile memory such as flash memory or EEPROM or other digital memory that retains its contents in the absence of power. In such implementations, the display can be powered by ambient illumination—implemented with photo-electric components similar to those found, for example, in many hand-held calculators. In this case the display, and the logic driving it, could be active only when there was ample ambient light. Implementations might also trigger such a display with a simple button or other switch. Such a display trigger button can also be implemented with other embodiments to conserve power.

Embodiments Requiring No Offline Power

Some illustrative embodiments use technology requiring no power to maintain the display—such as any of various electronic paper-based displays. Some examples are the Gyricon technology, from Gyricon LLC which was developed at Xerox PARC, and the e-ink technology from E Ink Corporation and manufactured by Royal Philips Electronics and others. For example, the e-ink technology is used in the Sony Librie EBP-1000 e-Book. There are also bistable LCD technologies that provide persistent displays after the power has been removed, such as the Cholesteric LCD which was developed with the help of Kent State University and marketed by Kent Display Systems. Additionally, Zenithal Bistable display technology (ZBD), developed by ZDB Displays, provides a second persistent LCD technology. All of these technologies offer extremely low power consumption and the ability for the image to persist after the power is removed. This technology offers significant advantages as a digital label when used with the embodiments described herein.

In such embodiments, the display itself sustains the image without requiring additional long-term power source. This embodiment may be the most economical to produce as it requires no offline power source. In accordance with an exemplary embodiment, with no offline power, the information displayed would use a single panel.

In these cases it is possible for an embodiment to update the display as the latest information is determined during each online session. In this context, an online session may be viewed as a period in which the device is powered on and connected to a computer or other host which performs read or write operations from or to the storage device.

The power scenarios outlined here are not intended to represent all possible options. Some implementations might use other strategies, or a mixed strategy, depending on cost and desired performance characteristics. For example, one such mixed scenario could have an embedded small fixed battery (e.g., CR2016) devoted to powering a timer (with an expected battery life of say 10 years), while the display could be powered as needed from ambient light using photo-electric cells.

Persistent Storage

Many illustrative embodiments will require the use of persistent storage to save device and display related data. Examples of information to persist include the amount of free space on the drive, last accessed and last updated values, state information related to monitoring disk structures, and of course user specified descriptive information.

One method of persisting the information is to record it in a dedicated flash or EEPROM device. Another method is to use battery backed up RAM either in the microcontroller or external to it. A economical alternative to these methods is to record the information on the storage device itself, for example, in a dedicated storage region During power up initialization the information is loaded into RAM. Similarly, during power down processing, changed information would be recorded in anticipation of the next session. During these periods it will become necessary to indicate device busy to prevent the host from interfering with this process by an untimely I/O request.

Unexpected loss of power should be dealt with. In one embodiment, the important data will be flushed to persistent storage after a period of idle time on the device, for example 1 minute of no activity. In another embodiment, the device is engineered such that there is enough time for the data to be moved to persistent storage between the power fail indication and the loss of a usable level of power.

An additional embodiment includes monitoring all of the relevant sectors of the storage device and re-processing each one once, the first time it is accessed in a session. If the logic is properly designed, for example, an incorrect value of free space on the drive that was the result of an unexpected power failure would slowly be corrected as FAT sectors were read and re-analyzed. The flowcharts in FIGS. 5A, 5B, 6A and 6B illustrate this technique. Refer to the description of those flowcharts below for more detail.

Combinations of these approaches may be used to solve this problem.

Implementations with External Controls

In accordance with one or more illustrative embodiments, an implementation that requires that the display be powered may include a user control for turning on the display. The same control can be used to turn the display back off, or it may have a timeout value that causes the display to turn off automatically after a predetermined interval.

In some implementations, especially where the information is likely to exceed the size of a display panel, it may be desirable to have a control, such as some type of button(s), whereby the user can navigate the display. As an example the display information may be structured into a series of "panels" and each button activation will cyclically step to the next panel in the series. This is especially relevant if the display screen is small—such as a single line.

More elaborate would be an implementation providing for display of the directory structure of the data stored in the device. In this case, the structure may be quite long. In such case the controls are likely to be more involved—allowing, for example, the ability for the user to scroll backward and forward through the directory structure and cause sub-folders (sub-directories) to be opened or closed, allowing nested data to be examined. A pair of buttons could be used to navigate the directory structure. The first button could be used to power on the device if depressed for, for example, 4 seconds. After power on, the same button could be used to scroll down the display. Button two could be used to select the currently highlighted directory. This would cause the contents of that directory to be displayed. Holding button two down for 1 second would cause the display to return to the previous level of display. The device would power off automatically after 60 seconds of inactivity, or when both buttons were displayed simultaneously.

An alternate embodiment of this user interface would involve using a touch sensitive screen. In this case a single button would be used to power the device on after a depression for, for example, 4 seconds. The top level directory would be displayed. Using a stylus or the tip of a ball point pen you would select a particular folder by tapping on it. Other navigation controls would be displayed on the screen for scrolling the screen up or down, and for navigating up one level to a parent directory.

A further device implementation would include the ability to display even more detailed information, such as actual "file" content.

Clocks and Timers

Using a clock in an embodiment allows the device to display the time and date that the device was last accessed and the time and date that it was last updated. When a clock is used in this fashion the device will provide a mechanism for setting the clock and adjusting for the local time zone. Localization of the time and date format is another issue that may be addressed. The clock and time source, e.g., crystal, will need to be of sufficient quality that substantial drift does not occur.

An alternative that avoids this problem is to use a timer that measures elapsed time rather than absolute time and date. Drift is much less of an issue, as it is unlikely that a user would ever hand calculate the relative time to check the displayed value. Relative times have no time zone issues and localization is less of an issue. One issue that should be considered when using elapsed times is the impact on persistent displays. An absolute time last updated would be a fixed value such as Apr. 1, 2004; whereas a relative time would be constantly changing. The longer a device goes without being updated, the larger the relative time would be. The value displayed would be incorrect unless refreshed from time to time.

Such timers and clocks require very little power—even small batteries can provide years of operation. Furthermore, rechargeable batteries can be used that are replenished whenever the device is operating with power from an external source (such as the host); thus eliminating the need to replace batteries.

In an alternate embodiment the need for a separate timing device is eliminated by programming the device microcontroller to track the time in a low power state.

A First Exemplary Embodiment

FIG. 1A depicts a first illustrative embodiment of the present invention showing an external hard drive 2 having a self-labeling display 4. The storage device 2 is a removable hard disk which can be attached to a host computer through a physical communication channel via a port 3 in the removable hard drive housing. In accordance with the first exemplary embodiment, the physical communication channel may be, for example, USB 2.0 (Universal Serial Bus), FireWire (the IEEE 1394 and 1394b standards), or a wireless communications channel. Examples of wireless communications channels are WiFi (IEEE 802.11a, 802.11b, 802.11g standards), Blue Tooth, or infrared (IrDA). Any of a variety of other conceivable means, e.g., Ethernet, token ring, ATA, SATA, SCSI, and serial SCSI, etc. could similarly be used.

Incorporated into the exterior body of this hard disk is an extremely low power LCD (Liquid Crystal Display) display 4 such as one of the displays identified above. A persistent display which persists after power is removed may be utilized.

While the disk is attached to a computer, digital logic in the device monitors the contents as they are being transferred to and from the hard disk to a host computer through the communication channel. In this illustrative embodiment, the digital logic uses its own solid state RAM to keep track of important disk records—such as the boot sector, and the sectors containing the FAT (File Allocation Table). In order to facilitate use with various operating systems, the digital logic is cognizant of hard-disk data configurations of the various popular file systems, e.g., FAT12, FAT16, FAT32, NTFS, WinFS, Linux Ext2, HFS and HFS+. It contains the logic to distinguish between them, and thus embodies the ability to automatically identify and filter content relevant to whatever the particular file system (or file systems) being used with the storage device. Size, cost and market constraints may dictate that only a subset of these formats is supported in a particular implementation.

For example, when the logic determines the file system is FAT12, FAT16 or FAT32 compliant, it can monitor/examine the Master Boot Record (MBR) and the Partition Boot Record (PBR) whenever they are read or written. From that it determines the number, size and location partitions on the device and number and location of FAT sectors. With this information it can monitor these structures whenever they are read or written. Proceeding in this manner with FAT12, FAT16 or FAT32 systems, the digital logic can determine:

The capacity of the device
The number and type of partitions on the device
The capacity of each partition
The available space on each partition
The volume serial number assigned to each partition
The volume label assigned to the partition by the user.

All or some of this information can be displayed. As the information is changed, the logic causes the display in the LCD to be updated. Virtually all removable storage devices on the market today contain a single partition. Some operating systems do not even support multiple partitions on removable drives. Therefore, most implementations can safely focus on a single partition per storage device.

In one exemplary implementation of the present invention, a fixed set of information is displayed on the screen. There is no requirement for input from the user. This implementation would require only one button 6, used to activate the display. Alternatively, the display may be continuously active and even that button 6 could be eliminated.

In accordance with an exemplary embodiment, a low power LCD is used and the device uses button 6 to activate the display for 1 minute when the device is offline. The display is updated once a minute while the device is online. The display contains:

The capacity of the only partition (MB)
The available space in the partition (MB)
The volume serial number of the partition
The volume label set by the user with the operating system label command In this scenario, there is no requirement to access the drive when it is not connected to a computer. Power would be required to operate the LCD display. Some LCD displays require logic to constantly refresh them. This too would require power. Some modern LCD displays are capable of maintaining their image without an external refresh.

Therefore, offline power requirements are minimal. Power can be supplied by a simple coin or watch battery. Other power sources are equally useful, such as a long term capacitor, solar cells and rechargeable batteries. The rechargeable batteries can be designed to draw power from the communications channel, for example, the USB bus.

In an alternative exemplary embodiment only the identities of relevant updated sectors would be saved until the device became idle. At that time it would identify itself to the host as being busy. Next each listed sector would be read and the appropriate analysis performed. In this way, a lower power processor could be used that might have otherwise impacted the performance of the device if analysis were performed during data transfer. By consolidating the list of updated sectors duplicate analysis could be avoided.

In accordance with the illustrative embodiment shown in FIG. 1A, the display automatically displays the drive capacity, which in this example is 80 gigabytes. Additionally, the amount of storage currently being used is displayed, which in this example is 27.3 gigabytes. The available space on the drive is additionally displayed, which in this example is 52.7 gigabytes.

As showed in FIG. 1A, the volume serial number of the partition/drive is displayed so that if a user has multiple such devices the user will be able to tell the devices apart. A volume label is also displayed which is set by the user employing an operating system label command, or through a GUI interface such as My Computer in Windows 2000, which likewise may be used to identify the storage device. Such file system volume label is typically subject to severe restrictions. For example, the FAT 16 file system limits the label to 11 characters, uppercase only and with no spaces and a restrictive set of punctuation symbols. A more flexible descriptive label may be used, in accordance with a further exemplary embodiment described below. This label is not subject to these restrictions. In addition, as described below with respect to a second embodiment, the time since last accessed and the time since last update may also be displayed. In accordance with this embodiment, an onboard timer or clock is used which permits the display of the time of the last access (if the timer is coordinated with real time) of how long it has been since the last access.

A wide range of information is contemplated for display in accordance with alternative embodiments. For example, at least one or more of the following additional information may be displayed in addition to storage unit total capacity, storage unit available space, volume serial number, and volume label:

Storage unit directory structure
Storage unit file names
Storage unit file contents
Device reliability statistics
   Hours of use
   I/O Error rate
   Total number of errors
   Device internal temperature
   Device fragmentation state
Owner contact information
   Company
   Department
   Name
   Address
   Phone
   Email address
Security status of content—could be useful for controlling what can be taken from a secured area. This would require software support.
Instructions for return of found property.

The volume label is subject to limitations imposed by the file system. For example, the FAT file system restricts the volume label to 11 characters, all uppercase, with no embedded spaces, and a restrictive set of punctuation and special characters. Many of the embodiments of this invention have greatly relaxed requirements for labeling with descriptive information. This information can be mixed upper and lower case, may have imbedded space, may use most special characters and punctuation, and may be multiple lines long or composes of multiple distinct fields, for example, company name and email address.

This display, for example, of device internal temperature, may be advantageously used to prevent the drive (and/or the host computer to which it is attached) from being destroyed due to extremely high temperature conditions. In a temperature sensing embodiment, the unit will, of course, be equipped with a temperature sensor whose output is appropriately coupled to a microcontroller for comparison with a predetermined temperature threshold. When, for example, the predetermined threshold is exceeded, an alarm signal may be generated, and, for example, broadcast to an appropriate set of individuals, e.g. members of the organization's IT staff. An audible alarm signal may likewise be generated. In accordance with an exemplary embodiment, the broadcast of an alarm may be triggered based upon exceeding either a predetermined temperature threshold (e.g., 85 degrees F.) or the rate of escalating temperature change or a combination thereof (e.g., 80 degrees F. and escalating at 5 degrees per hour). Such a drive-based temperature monitoring/alarm system may give an earlier warning to an impending disastrous situation when compared to a conventional room air conditioner controller-based temperature sensing/alarm system due in part to its close location to the heat source.

The hard drive 2 may include a wide range of control/data keys for controlling the various functions described herein and for data entry of user defined text messages. For example, in the embodiment shown in FIG. 1A, a control key 6 may be utilized to turn the LCD display 40N when the display is implemented with a non-persistent type LCD display. In implementations where persistent display technology is utilized, control key 6 would, of course, not be necessary for turning the display on and off, but may be eliminated or utilized to control other functions. Control key 8 may be utilized to, for example, navigate through, for example, the drive directory structure. The control key 8 may likewise be utilized to scroll the display to present various fields in the display window when there are more fields to be displayed than will fit in the display window. In alternative embodiments, the LCD display 4 may be displayed at all times depending upon the LCD technology utilized and the size of the battery. Display 4 will be active whenever it is connected to the, for example, USB interface of a host computer during online usage. During online usage, the display is active and would be updated at, for example, one minute intervals.

The hard drive 2 is preferably dimensioned to comfortably fit in a shirt pocket and may be, for example, 3¼ inches wide by 5 inches long. It should be understood that the LCD display may be any size desired limited by the size of the portable drive depending upon the particular application.

Second Exemplary Embodiment

A second illustrative embodiment is an extension of the First Exemplary Embodiment, including a battery-powered clock. The reference to batteries herein is intended to refer to any means of supplying sustained power while the device is offline. Such power sources are typically batteries, but could be implemented as long-term capacitors, or as other types of power generating cells. Having an onboard timer or clock permits the display to show the time of the last access (if the timer is coordinated with real time), or how long it has been since the last access. Such temporal indications can be applied to the time of the last access, the time of the last modification, or to measure any interesting interval.

For this exemplary embodiment a low power LCD is used and the device has a button 6 used to activate the display for, for example, 1 minute when the device is offline. The display is updated once a minute while the device is online. The display 4 contains at least:

The capacity of the only partition (GB)
The space used on the partition (GB)
The available space in the partition (GB)
The volume serial number of the partition
The volume label set by the user via the operating system label command
Time since last access
Time since last update In this embodiment both a FireWire (IEEE 1394A) interface and a USB 2.0 interface are supported. This gives the user additional flexibility when selecting a host for connecting thereto.

Figure 2:
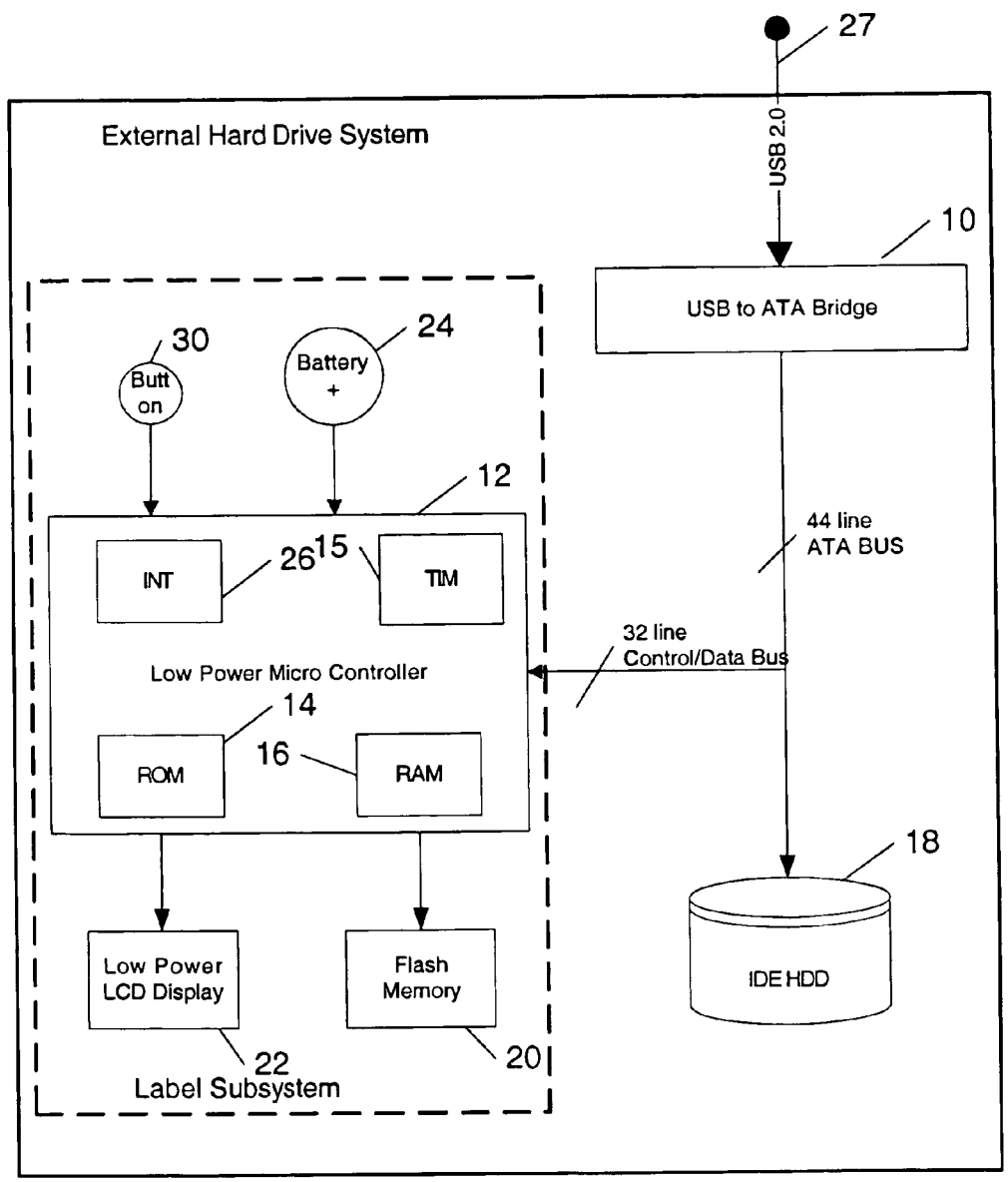
FIG. 2 is hardware block diagram of an illustrative USB compatible hard drive in accordance with a first exemplary embodiment.

FIG. 2 is an illustrative hardware block diagram of a USB-compatible hard drive in accordance with the first exemplary embodiment such as that shown in FIG. 1A. The hard drive includes an interface to the USB 2.0 bus 27 and it includes a commercially available USB to ATA bridge 10 which takes signals from the host computer USB interface 27 and converts these signals to ATA interface-compatible signals utilized by a typical IDE hard drive 18. Hard drive 18 in the FIG. 1A exemplary embodiment may be, for example, a 2½ inch hard drive having a drive capacity of 80 gigabytes.

The USB-compatible external hard drive 2 also includes a microcontroller 12 having an onboard ROM 14 storing the firmware logic embodied in the flowcharts described below. Microcontroller 12 also includes an onboard RAM 16 for storing the variables used during the microcontroller firmware execution. It should be recognized that, as opposed to using a commercially available microcontroller 12, onboard ROM 14, interrupt controller 26, interval timer 15 and RAM 16, a custom ASIC may be utilized to implement all the functionality described herein. It would be especially beneficial and economical to enhance an existing ASIC to incorporate this technology. For example, a flash drive design that is based upon a single ASIC may be enhanced to incorporate an embodiment of the present invention, reducing design time and cost and greatly reducing the manufacturing cost for large volumes of devices.

The microcontroller 12 is coupled to a flash memory 20 for nonvolatile storage. Non-volatile storage media other than flash memory also may be utilized.

Button 30 represents a wide range of control keys/data keys/keyboards that are utilized in a give implementation (e.g., control keys 6 and 8 in FIG. 1A). The keys may be used to permit the input of user-defined messages as will be explained further below.

The set of control keys/data keys is coupled to the micro controller onboard interrupt controller logic 26. The interrupt controller 26 detects the depression of, for example, a control key and communicates this event to microcontroller 12, which appropriately interprets the interrupt to implement the requested function(s) controlled by the respective control/data key. The interrupt controller logic 26 may be a separate interrupt controller device if, for example, the complexity of the application demands more capability than is present in the onboard interrupt controller of microcontroller 12. The onboard interval timer 15 of the microcontroller 12 is utilized to measure small time intervals such as the display timeout that causes the display to be turned off after, for example 1 minute.

The microcontroller 12 is also coupled to a low power LCD display 22, such as that represented by LCD 4 in FIG. 1A. LCD display 22 is powered by battery 24. Display 22 is preferably implemented with one of the low power LCD display technologies or any of the persistent display technologies identified above.

Figure 3:
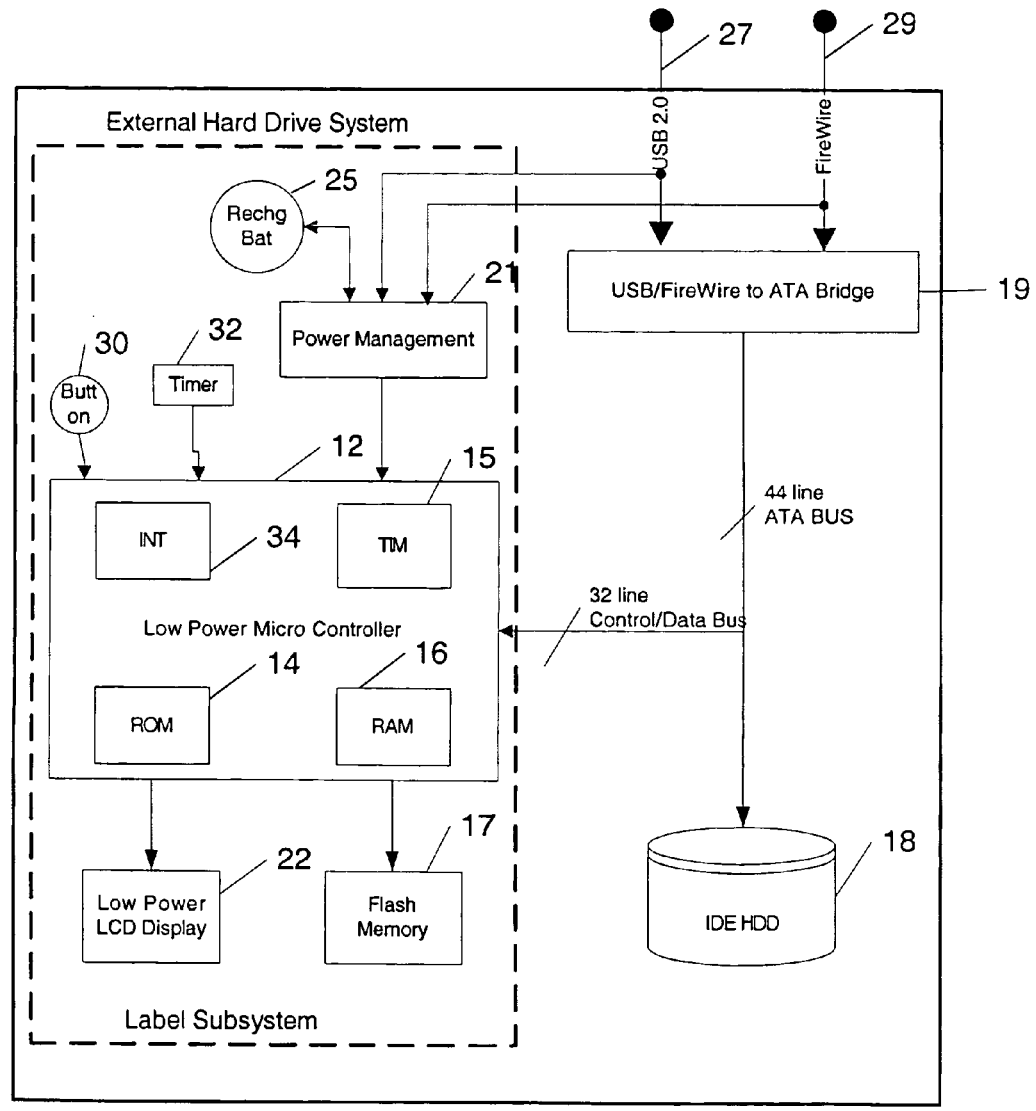
FIG. 3 is a block diagram of an illustrative hybrid USB/FireWire hard drive in accordance with a second exemplary embodiment.

FIG. 3 is an illustrative hardware block diagram of a hybrid USB/FireWire external hard drive in accordance with the second exemplary embodiment. Since FIG. 3 includes various components that are identical to those described in FIG. 2, the description of these common components will not be repeated.

In addition to the USB 2.0 interface 27 present it FIG. 2, FIG. 3 includes a FireWire interface 29. Thus, in this embodiment, two ports are utilized. The external hard drive of FIG. 3 includes a commercially available hybrid USB/FireWire to ATA bridge chip 19, which interfaces with both the USB 2.0 interface 27 and FireWire interface 29 and converts such signals to ATA signals compatible with IDE HDD 18. At most one interface may be active at a time.

A timer chip 32 that generates absolute and/or relative time related signals is also included. The timer 32 includes a continuously running clock which is set, for example, to a time base such as UCT (Coordinated Universal Time). Coordinated Universal Time is the basis for the worldwide system of civil time. This time scale is kept by time laboratories around the world, including the U.S. Naval Observatory, and is determined using highly precise atomic clocks.

The changes of value of such a continuously running clock may be displayed to, for example, indicate the time since the last update of the hard drive. For example, if the drive is updated at 6:00 p.m., microcontroller 14 accesses timer 32 and generates a time stamp that represents the present time. If in two weeks a user depresses a control button 30 associated with display 22, microcontroller 12 will access timer 32 to obtain the current time, generate a further time stamp and display the difference between the two generated values as the time since the last update (e.g., two weeks, 17 hours, 18 minutes).

This exemplary embodiment contains Power Management logic 21 that monitors the state of the USB 2.0 27 and FireWire 29 interfaces. When power is present on one of these interfaces the external hard drive FIG. 3 is placed in the online mode. While in the online mode the Power Management logic 21 extracts power from the active interface to power the device. Furthermore, Power Management 21 provides a trickle charge to Rechargeable Battery 25. When Power Management determines that neither interface is active, the device is powered by Rechargeable Battery 25.

Figure 4:
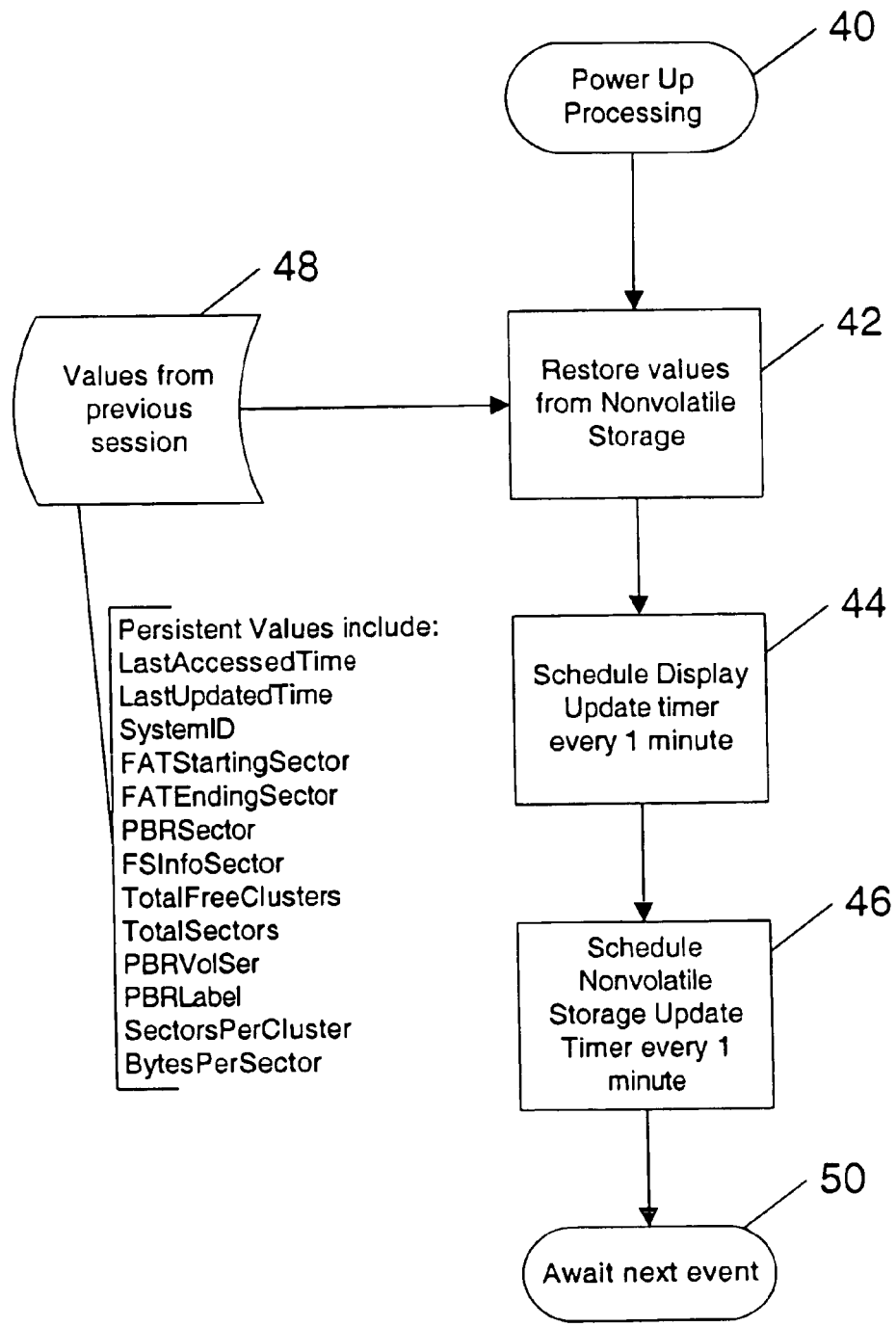
FIG. 4 is a flowchart delineating the sequence of operations performed during power up processing.

FIG. 4 is a flowchart delineating the sequence of operations performed during power up processing. FIG. 4 shows the operations that are performed, for example, when the drive is connected to a host computer and host power is applied. This processing corresponds to the drive transitioning from the offline state to the online state.

During power up processing (40), the contents of the non-volatile storage, such as flash memory 20, are copied into RAM. In this fashion, values stored in the flash memory 20 from a previous session (48) are copied to onboard RAM 16 (42). These values from the previous session represent the current state of the hard drive.

In accordance with an exemplary embodiment, as shown in FIG. 4, these persistent values include: the last accessed time (LastAccessedTime), the last updated time (LastUpdatedTime), and SystemID, which defines, for example, that a FAT (File Allocation Table) file system is being employed. The SystemID may define the file system as being, for example, a FAT 12, FAT 16 or FAT 32 file system.

The persistent values in accordance with this illustrative embodiment also include the FAT starting and ending sectors (FATStartingSector, FATEndingSector) which define the location on the drive where the file allocation table is located. The FAT is monitored to determine the amount of hard drive free space.

The persistent values also include PBRSector, FSInfoSector, TotalFreeCusters, and TotalSectors. PBRSector is the sector number for the partition boot record. FSInfoSector is a location on the drive which gets updated periodically to define the amount of free space in a FAT 32 system. The total free clusters (TotalFreeCusters) is the current value of free clusters. The TotalSectors is an array which specifies the total number of free sectors in a FAT sector. Whenever a change is made to a FAT sector, a corresponding entry is made in the TotalSectors array.

Other persistent values include the PBR volume serial number and PBR label (PBRVolSer and PBRLabel) and SectorsPerCluster and BytesPerSector. PBRVolSer and PBRLabel are the values that are displayed on the LCD display identifying the drive. The SectorsPerCluster value is a value indicating the number of sectors in a cluster and is obtained from the partition boot record as is the bytes per sector value. The bytes per sector value is typically 512 bytes.

With such information obtained from the various persistent values described above, cluster information may be converted into megabytes for free space calculations.

After the values are restored from nonvolatile storage (42), a display update is scheduled, using onboard timer 15 every minute as long as the hard drive is connected to the host computer (44). Thereafter, a nonvolatile storage update is scheduled at minute intervals (46) using onboard timer 15. When the drive is actually in use, this update will not occur. The nonvolatile storage is updated every minute in case of an unexpected power failure. Thereafter, the routine awaits the next event (50).

Figure 5A:
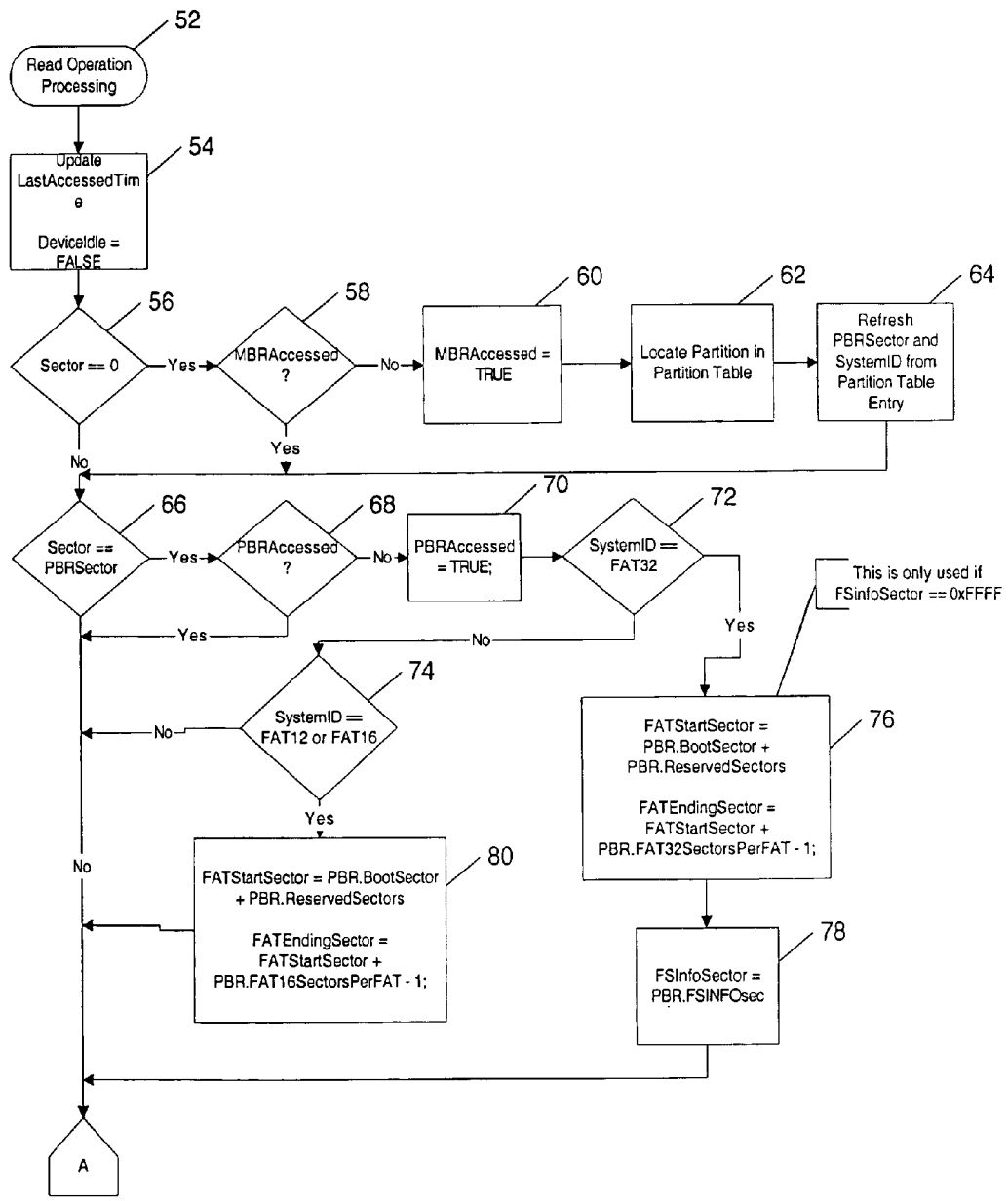
FIGS. 5A and 5B are a flowchart that delineates the sequence of operations involved in read operation processing.
Figure 5B:
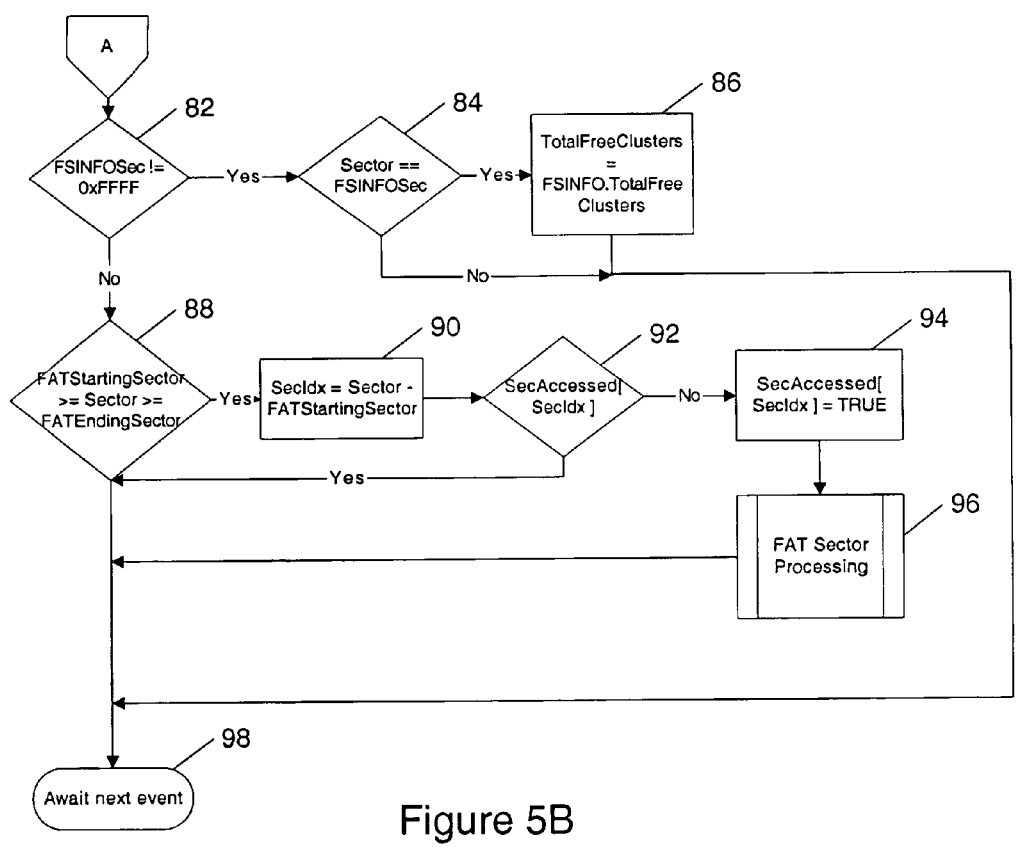
Figure 6A:
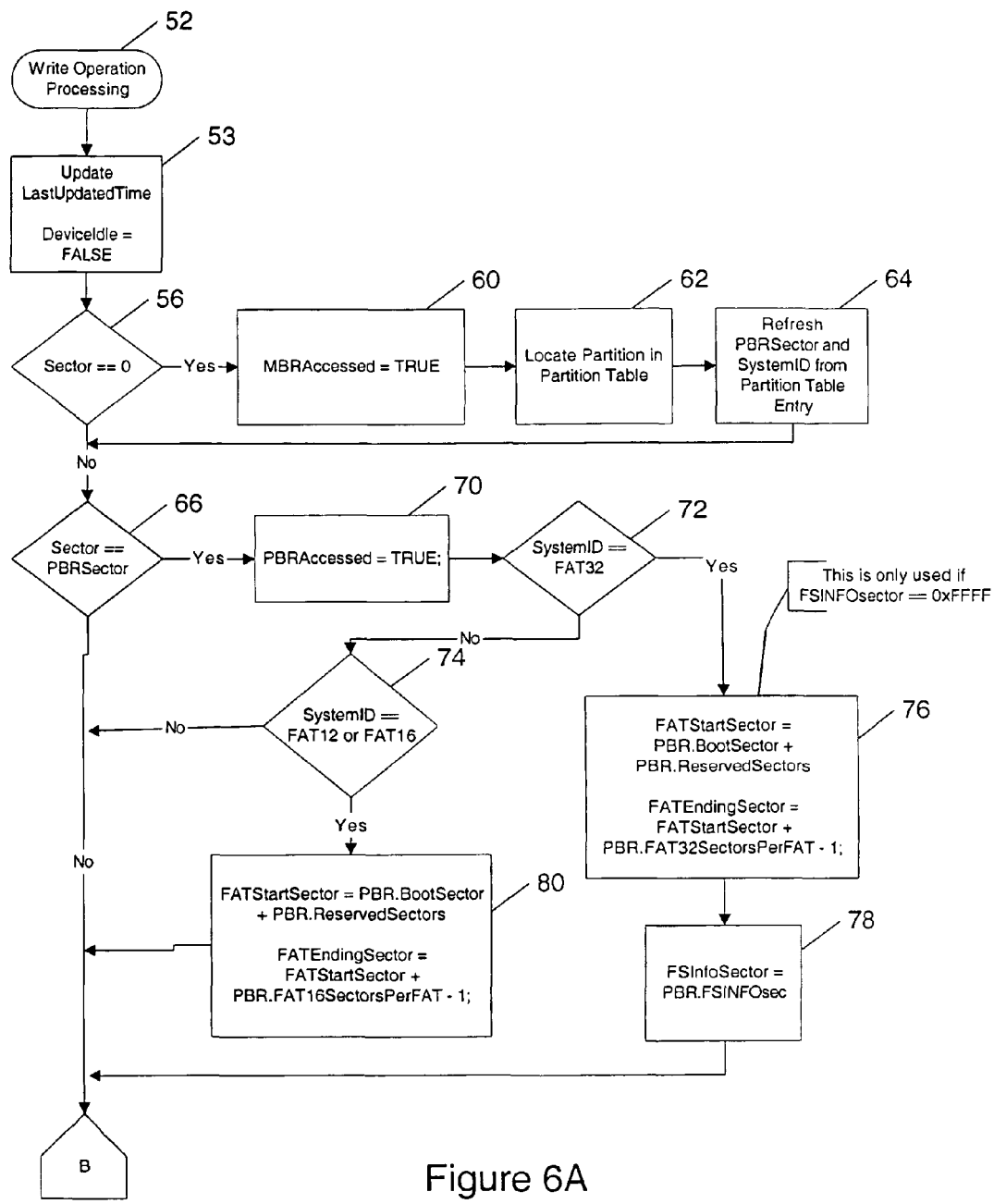
FIGS. 6A and 6B are a flowchart delineating the sequence of operations involved in write operation processing.
Figure 6B:
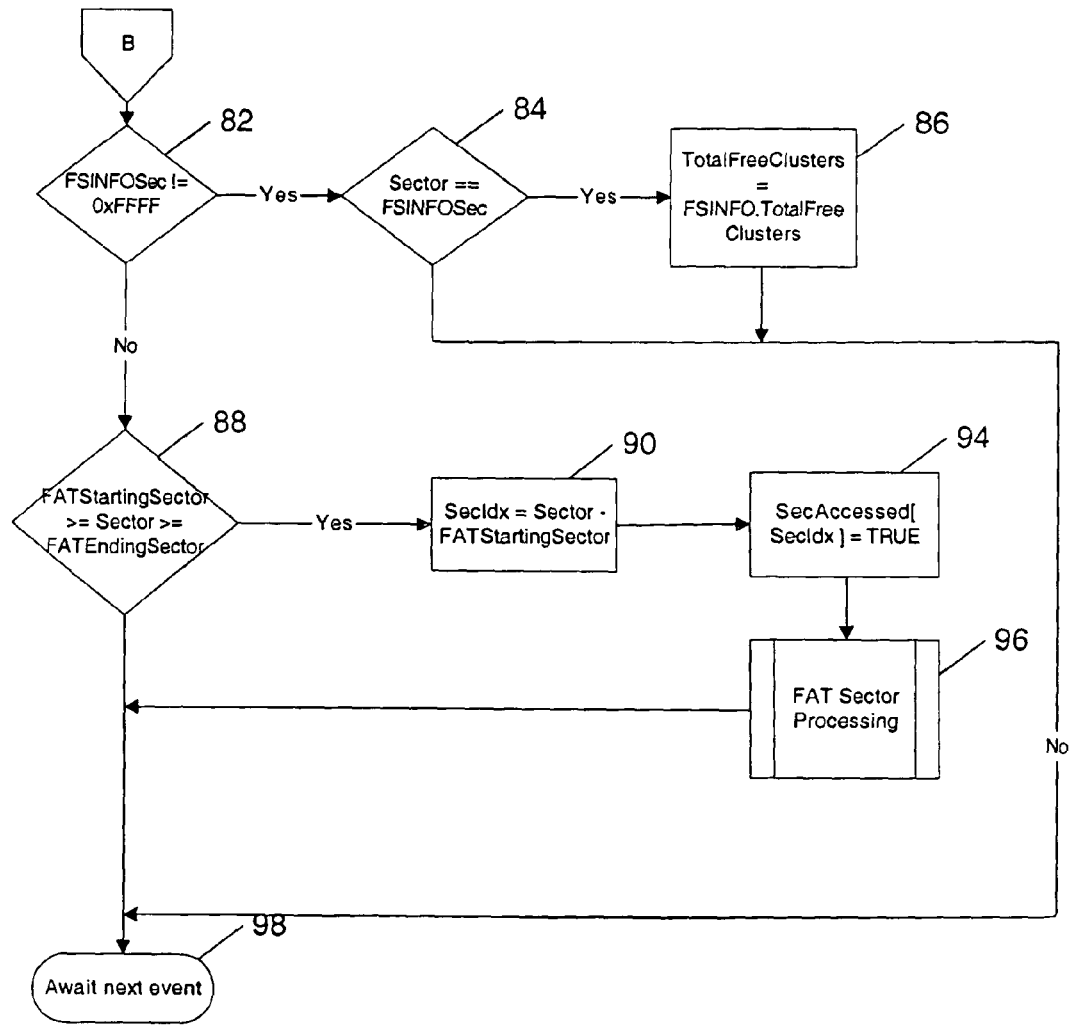

FIGS. 5A and 5B is a flowchart delineating the sequence of operations involved in read operation processing. Whenever a read operation is, for example, requested by the host computer to read a file, read operation processing is initiated (52). Read operation processing permits the system to properly function when the persistent value information is out of synchronization with the actual state of the drive. During read operation processing, access flags are associated with various variables described below to ensure that the operation is only performed once per session after the drive is powered up. Thereafter, the very similar write monitoring processing shown in FIGS. 6A and 6B is relied on to discover any changes to the persistent values. The values in onboard RAM 16 are refreshed to ensure that they are current during this processing.

The last access time (LastAccessTime) is updated in RAM 16 and a device idle (DeviceIdle) flag is set to false, indicating that the device is currently not idle (54).

A check is then made to determine whether the physical sector 0 is being read (56). The physical sector 0 stores the master boot record (MBR). The master boot record contains the partition size and location information needed to locate, for example, the partition boot record.

If the MBR is being accessed, then a check is made to determine whether the flag MBRAccessed is true (58). If MBRAccessed is not true, then the MBR accessed (MBRAccessed) flag is set to true, so this branch of the routine will not be accessed again for the current session (60).

Thereafter, the partition in the partition table is located (62) and the PBRSector and the SystemID from the partition table entry are refreshed (64) to make sure they are accurate and not out of synchronization with the actual hard drive state. Although nonvolatile storage is updated once a minute, if the power is turned off prematurely by a user, for example, disconnecting the hard drive from the host, such refreshing assures the accuracy of such persistent values.

After the processing at 64 or if the sector being read is not physical sector 0, a check is made to determine whether the sector equals the PBRSector (66), If the sector being read is the PBRSector, then a PBRAccessed flag is checked to determine whether it is true or not true (68). If the PBRAccessed flag is not true, the PBRAccessed flag is then set to true (70) to prevent repeated performance of this processing branch after the first session.

A check is then made of the SystemID to determine if it indicates a FAT 32 file system (72). If the SystemID indicates that a FAT32 file system is being utilized, then the FATStartingSector and the FATEndingSector values are calculated as indicated by the operations set forth in block 76. The processing in block 76 is only necessary if there is no entry in FSInfoSector which is indicated by the hexadecimal value (indicated in the flowcharts by "0xFFFF"). Thereafter, FSInfoSector is set in accordance with the appropriate value in the partition boot record (78).

If the check at block 72 indicates that the FAT32 is not being used, then in this illustrative embodiment a check is made to determine whether the file system is FAT12 or FAT 16 (74). If not, the routine branches to block 82 in FIG. 5B. If the file system is a FAT12 or FAT 16, then the FATStartingSector and the FATEndingSector are determined in a manner similar to the FAT 32 processing except different fields are accessed as indicated at block 80.

As indicated in FIG. 5B, a check is then made of FSInfoSector to determine whether it is not equal (!=) to 0xFFFF (82). For a non-FAT32 drive, FSInfoSector will be initialized to 0xFFFF. For a FAT32 drive, the check at block 82 should generally yield a "yes" result. Under some circumstances, however, it will yield a "no". Thus, for a FAT32 file system, processing will generally proceed to decision block 84 to determine whether the current sector is FSInfoSector. If the current sector is not FSInfoSector, then no further processing is required and the routine branches block 98 to await the next event.

If the current sector is FSInfoSector, then the total free clusters (TotalFreeClusters) is determined as indicated at block 86. Thereafter, the routine branches to block 98 to await the next event.

If the check at block 82 yields a "no" result, then a check is made to determine whether the sector being read is in the range between the FATStartingSector and the FATEndingSector (88). If so, then a sector index (SecIdx) is calculated by subtracting the FATStartingSector from the sector being accessed (90). A check is then made to determine whether the access flag SetAccessed [SecIdx] for a FAT sector is true (92) so that the operation is only performed once per FAT sector. This check monitors the FAT and determines whether during the current session the current sector has been accessed. If the FAT sector has been accessed, then no further processing is done and the routine waits for the next event (98).

If the sector had not been accessed during the current session, then the flag is set to indicate that it has been accessed (94). Thereafter, the FAT sector processing is performed to monitor changes in the FAT in accordance with either the flowchart of FIG. 10 or alternatively FIG. 11, which will be described below. In order to avoid obfuscating the invention, in accordance with the described exemplary embodiment, the processing is not shown as taking into account that the last FAT sector may be partially full. As will be appreciated by those skilled in the art, such processing will slightly overstate the number of free clusters.

FIGS. 6A and 6B is a flowchart delineating the sequence of operations involved in write operation processing. Write processing is very similar to the above-described read operation processing as indicated by the identically labeled flowchart blocks. Accordingly, a description of the identical processing operations will not be repeated but only the differences from the read processing will be described.

As shown in FIG. 6A, in write operation processing, the updating operation that occurs at block 53 is to update the last updated time (LastUpdatedTime) as opposed to updating the last accessed time as was done in read processing. A further difference between the write processing and the read processing is that the read processing flag checking operations at blocks 58 and 68 in FIG. 5A are not performed in write operation processing since the write operation processing is performed more than once per session.

Similarly, with respect to FIG. 6B, the flag checking operation (of "SecAcessed") that is performed at block 92 in FIG. 5B does not occur during write processing. Otherwise, the write processing operations of FIG. 6B is the same as the above-described read processing of FIG. 5B.

Figure 7:
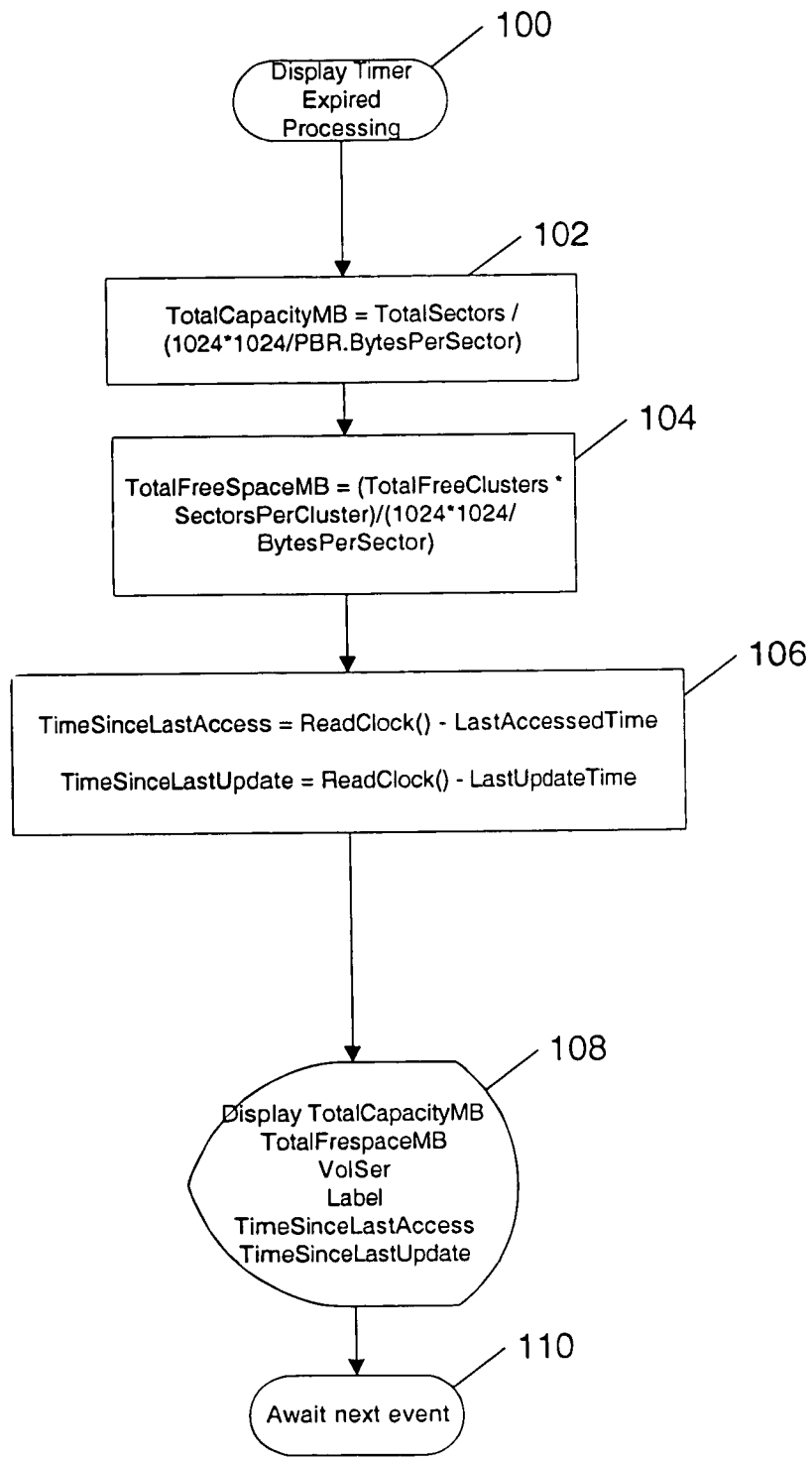
FIG. 7 is a flowchart delineating the sequence of operations involved in updating the display 4 shown, for example, in FIG. 1A.

FIG. 7 is a flowchart delineating the sequence of operations involved in updating the display 4 shown, for example, in FIG. 1A. When the display timer expires indicating that the display must be updated (100), the total capacity in megabytes (TotalCapacityMB) of the drive is calculated as set forth in block 102. Thereafter, the total free space in megabytes (TotalFreeSpaceMB) is calculated as set forth in block 104.

The time since last accessed (TimeSinceLastAccess), which is a relative time, is calculated by subtracting the last access time from the current clock reading, as shown in block 106. Additionally, the time since the last update (TimeSinceLastUpdate) is calculated by subtracting the last update time from the current clock reading as shown in block 106.

Based on the above calculations and other accessed data, the total capacity, total free space, volume serial number, label, and the time since last access and last update are displayed (108). The routine then awaits the next update display event (110).

Figure 8:
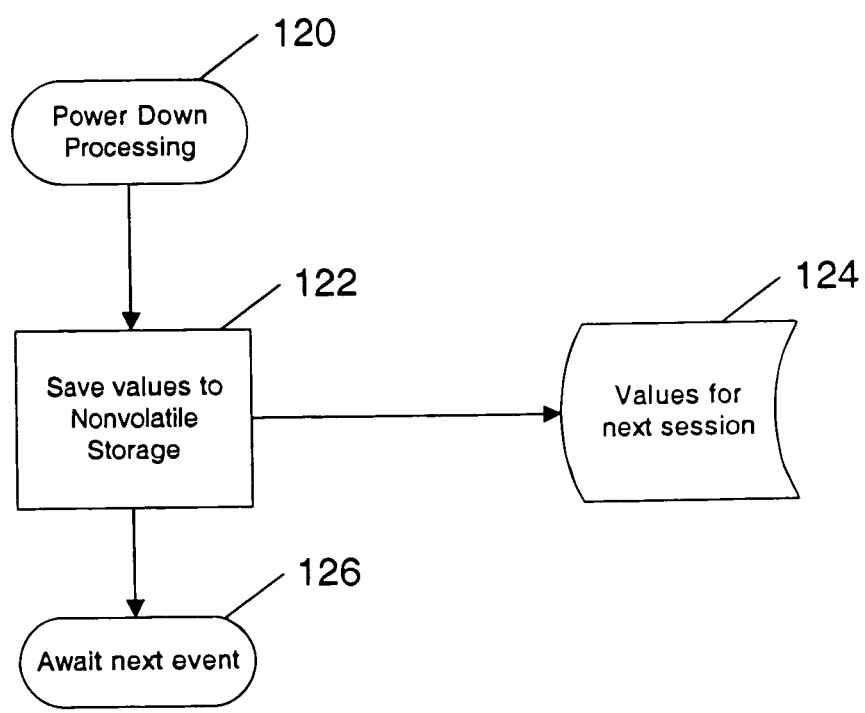
FIG. 8 is a flowchart delineating the sequence of operations involved in power down processing.

FIG. 8 is a flowchart delineating the sequence of operations involved in power down processing. Power down processing occurs when the external hard drive, is transitioning from the online state where it is accessible by the host to the offline state where it can be disconnected from the host. During a normal power down operation, a signal is generated from the active interface, either the USB 2.0 interface 27 or the FireWire interface 29. That signal is detected by the Power Management logic 21 which in turn signals the microcontroller 12 via the onboard interrupt controller 34, (120). Alternatively, power down processing may be initiated when the host computer is being shut down.

The power down processing signal triggers the saving of values by storage in the nonvolatile storage (e.g., flash memory 20 shown in FIG. 2) (122) to preserve the values for the next session (124). Thereafter, the routine awaits the next event (126).

Figure 9:
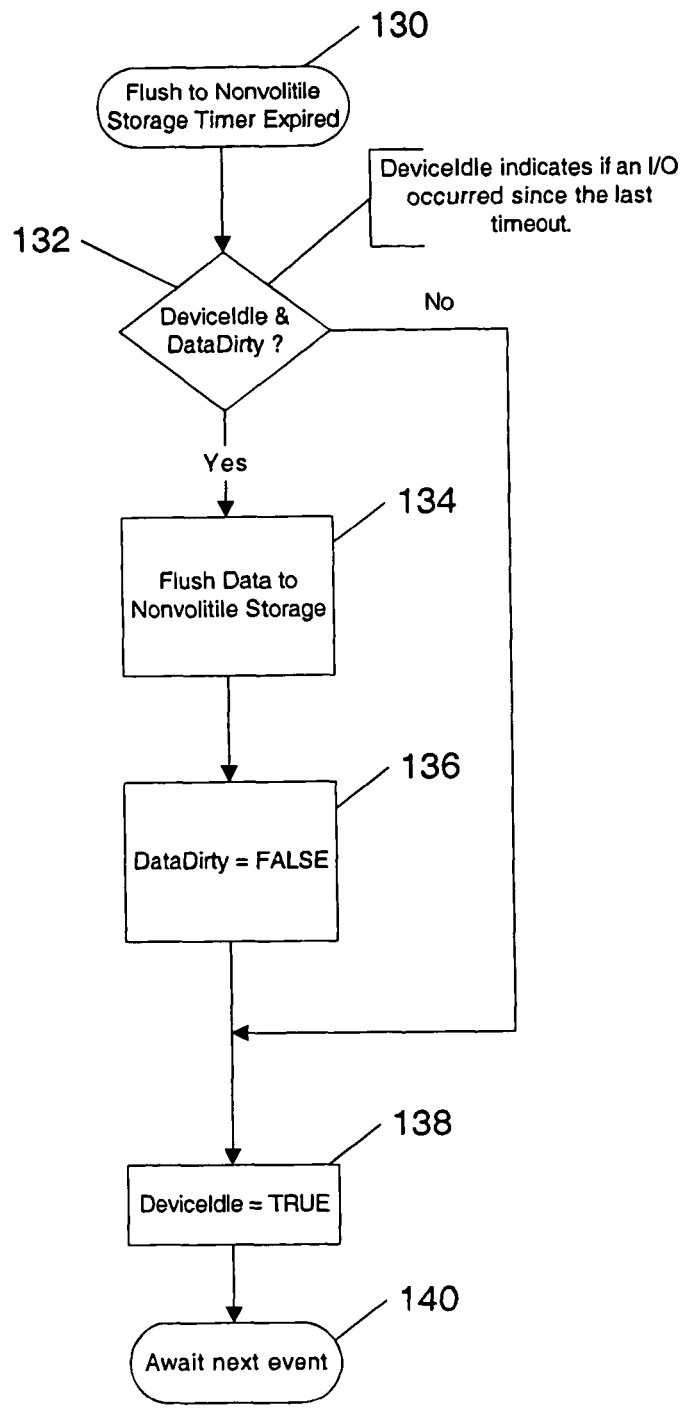
FIG. 9 is a flowchart delineating the sequence of operations involved in flushing data from volatile RAM memory to non-volatile flash memory.

FIG. 9 is a flowchart delineating the sequence of operations involved in flushing the nonvolatile flash memory. In an exemplary embodiment, this operation once a minute. The values in the microcontroller's RAM 16 are utilized to update the flash memory 20.

When a timer expires indicating that it is time to flush to nonvolatile storage (130), a signal is generated which initiates a check is made of the state of the flags DeviceIdle and DataDirty (132). DeviceIdle is set to true if no reads or writes have occurred in, for example, the last minute (since the last time out). The DataDirty indicator/flag is set if the device has changed since the last time a flush occurred. Thus, if there is nothing new to flush, the flush will not take place.

If both device idle and data dirty are set as indicated by the check at 132, then the data is flushed to nonvolatile storage (134). Thereafter, the data dirty flag is set back to false (136). DataDirty is set to true whenever a value is changed that is to be written to nonvolatile storage.

If the check at block 132 indicates that the DeviceIdle and DataDirty are not both set or after the DataDirty is set to false, then the routine sets DeviceIdle to true (138). The routine thereafter awaits the next event (140).

Figure 10:
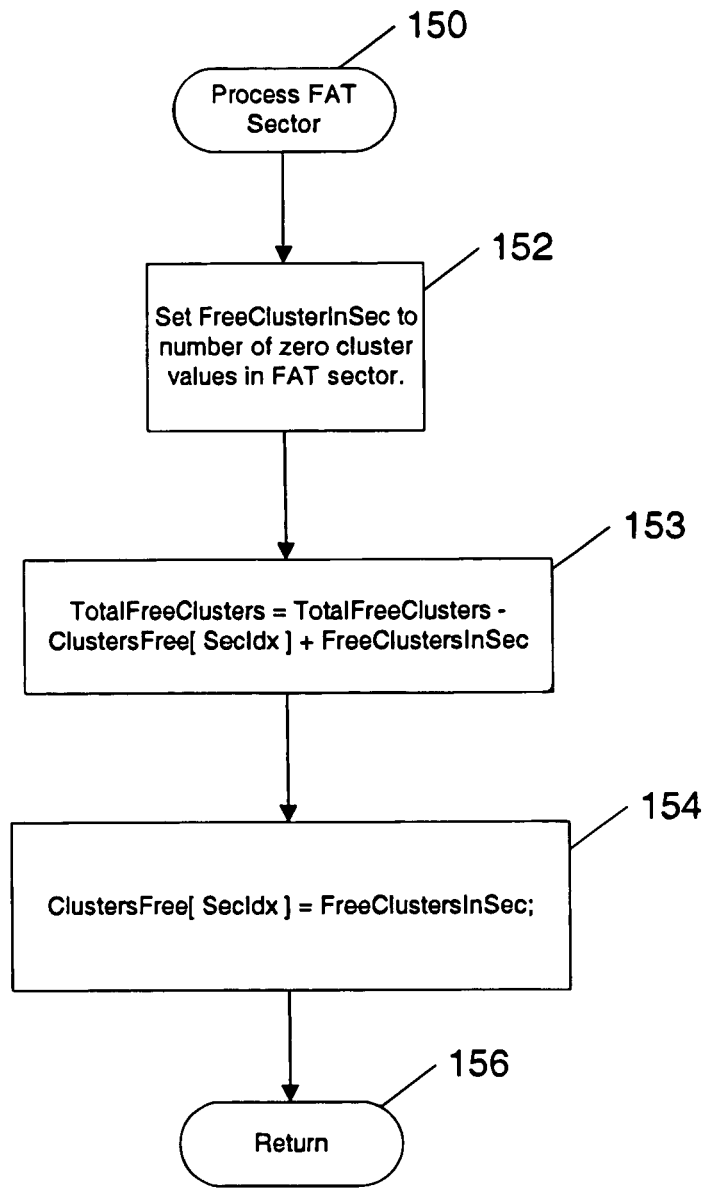
FIG. 10 is a flowchart delineating the sequence of operations involved in FAT sector processing.

FIG. 10 is a flowchart delineating the sequence of operations involved in FAT sector processing. The FAT sector processing routine is called during the read and write processing described above with respect to FIGS. 5A, 5B, 6A and 6B. A FAT sector is processed (150) to determine the number of free sectors available.

As indicated at block 152, the routine sets the free clusters in sector (FreeClusterInSec) to the number of zero cluster values in the FAT sector, since the FAT stores a zero for every cluster that has no data stored in it. Thus, in this exemplary fashion, this routine monitors the contents of the FAT. Thereafter, the total free clusters (TotalFreeClusters) is adjusted by the value just calculated based upon the processing shown at block (152). As indicated in block 153, the previous value for free clusters stored in the array ClustersFree at the location indicated by SecIdx is subtracted from TotalFreeClusters and the new value of free clusters are added. SecIdx represents a cell in the array for FAT sector 0, 1, 2, etc. The array represents the number of free clusters in each corresponding FAT sector. The particular FAT sector that is being processed is identified by a cell in the array.

After the processing at block 153, the value of ClustersFree at location SecIdx is updated to store the updated free clusters value (FreeClustersInSec (154), and the routine returns to the calling routine (156).

Figure 11:
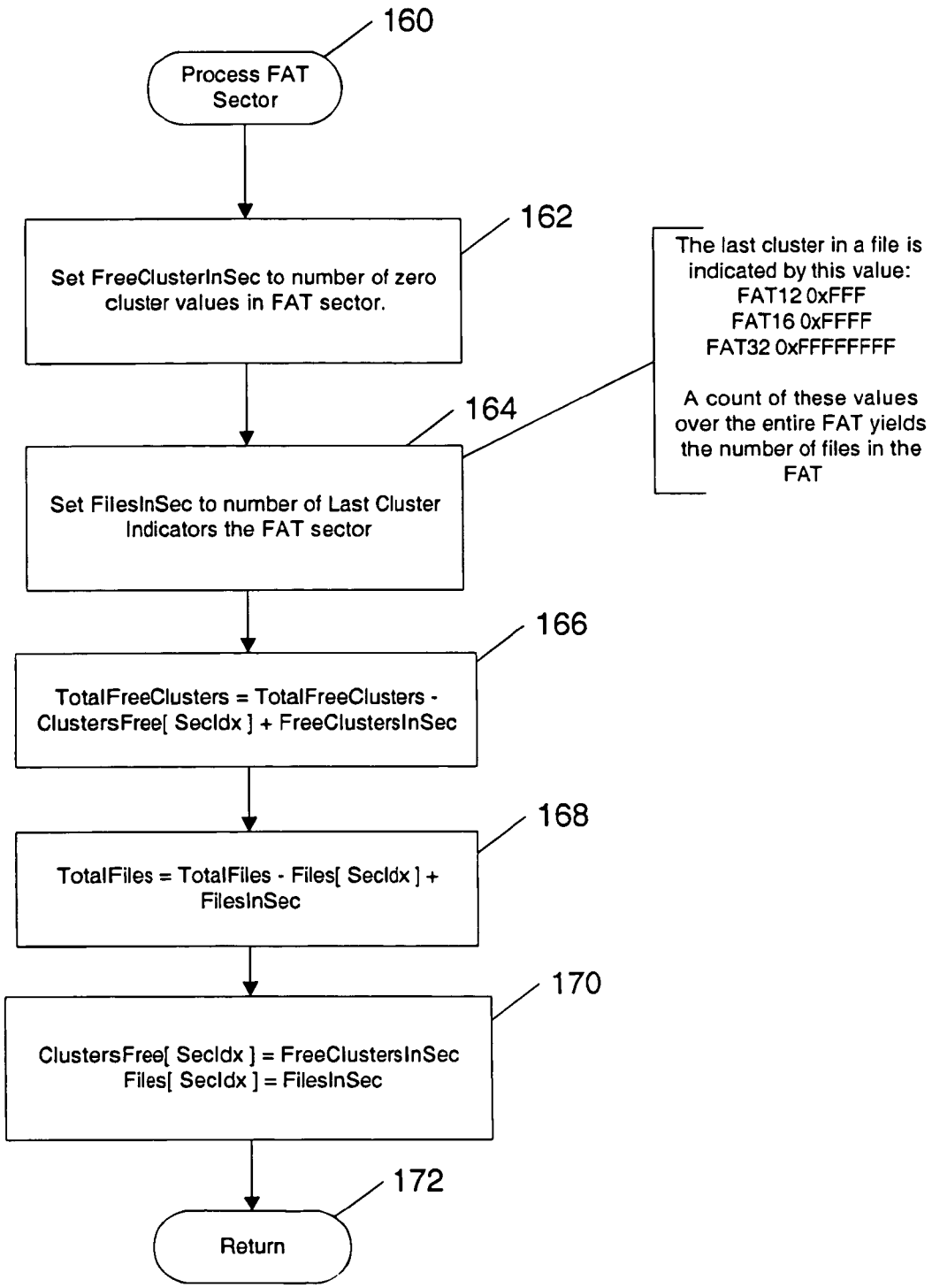
FIG. 11 is a flowchart delineating the sequence of operations involved in enhanced FAT sector processing.

As an alternative to the FIG. 10 FAT sector processing, FIG. 11 is a flowchart delineating the sequence of operations involved in enhanced FAT sector processing. The processing of FAT sectors (160) begins by setting the free clusters in sectors (FreeClustersInSec) to the number of zero cluster values in the FAT sector (162) as explained above in conjunction with FIG. 10. Thereafter, the files in the sector (FilesInSec) are set to the number of last cluster indicators. The very last cluster for a file is represented in the FAT by a special value. A count of these values over the entire FAT yields the number of files in the FAT. Therefore, counting these values in a FAT sector gives a count of the number of files that end in that FAT sector. As shown in FIG. 11, this last cluster indicator has the values shown in FIG. 11 for FAT 12, FAT 16 and FAT 32 file systems, respectively.

Thereafter, the total free clusters (TotalFreeClusters) are calculated (166) and the total files (TotalFiles) are calculated (168). Finally, the number of free clusters ClustersFree array and the number of files, TotalFiles array are updated at the location indicated by SecIdx (170). Thereafter, the routine returns to the calling routine (172).

An alternate embodiment of a removable media drive would track the contents of folders (directories) on the drive. As folders were created and destroyed the names and relationships of these folders would be tracked. Key information about the folders would be recorded into non-volatile storage such that the directory structure of the drive could be browsed while offline. Most importantly, this embodiment would not require the powering up of a removable media drive in offline mode, which would place a far greater demand on the devices offline power source. A first method for performing monitoring involves a design similar to FIG. 2 and FIG. 3. The microcontroller or other control logic would monitor changes made to directory sectors and maintain a representation of the directory information in non-volatile storage sufficient to allow offline browsing of the drive directory structure. This will require more processing power and a larger non-volatile storage module than is required for the first or second embodiment above. At a minimum, the directory information would include a representation of the directory names and a representation of the hierarchical relationship between parent and child directories and between sibling directories.

A further alternate embodiment builds upon the previous embodiment. In addition to directory names, file names would also be tracked and stored in non-volatile memory. With this further embodiment a user would be able to track details about files contained within directories. These details would include a representation of the file names. Optionally, other file details would be tracked, such as date last accessed, date last changed, file attributes and file type, including for example, mime type of the file. More processing capabilities and larger non-volatile storage would be required than the previous embodiment.

A slightly less sophisticated alternate embodiment of a removable media drive would track directory contents as above, however only the lowest lever directory, often called the root directory, would be tracked. This embodiment offers reduced processing requirements and non-volatile storage requirements than the previous two embodiments.

All of these embodiments could be facilitated with the aid of driver software executing on the host system. For example, in the Windows 2000 operating system a file system filter driver could be employed to track file and directory creation, deletions, and movements. While such a driver would impose additional installation requirements on a user, there would be a corresponding reduction in hardware cost for the removable drive due to the reliance on the host processor for much of the difficult task of tracking changes.

Third Exemplary Embodiment

Figure 1B:
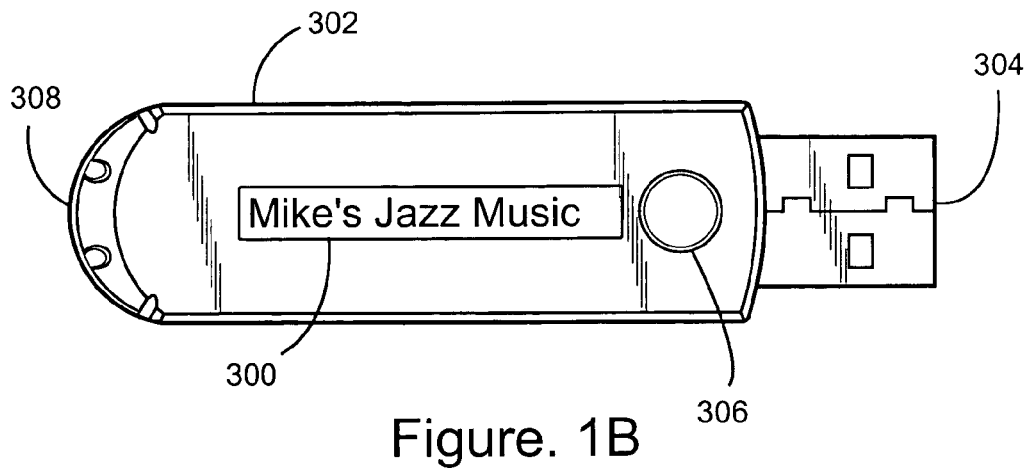
FIG. 1B is an illustrative embodiment of the present invention depicting a flash drive having a self-labeling display.

In accordance with a third exemplary embodiment, FIG. 1B illustrates a small portable "flash" memory storage device 302 smaller than a pocket comb with a USB Type A connector 304 to allow connecting to a computer's USB socket is utilized. On its side is a small single-line LCD display 300 used to show various panels, one line per panel. In accordance with an exemplary embodiment, the first panel shows the volume serial number assigned to the device, the second shows the amount of available (presently unused) storage capacity, while the third shows a line of user-supplied description as depicted 300.

There is a single button 306, which activates the display. If pressed again within a certain period (before the display is turned off), the display advances to the next panel, cycling back to the first after 3 clicks. The display information is held in flash memory—which depending on the embodiment might or might not be distinct from the memory used by the content memory. Also depending on the implementation's cost parameters, the power for the display is provided by a small photo-cell powering the meager processing requirements to access and display the stored "label" information.

Fourth Exemplary Embodiment

This is similar to the Third Exemplary Embodiment, with the added feature of an additional timer, allowing a fourth display panel showing how long it has been since the stored data was connected to a host and last modified. The clock and the display feature are powered by a small lithium-ion battery, which is recharged whenever the device is connected to a USB port.

In both the Third and Fourth Exemplary Embodiments, the control logic monitoring data flow between host and device is primed to recognize a private protocol. In accordance with an exemplary embodiment, this private protocol control logic may also be incorporated into the external hard drives shown in FIGS. 1A, 2 and 3.

In this protocol, a special protocol signature is used to reduce the possibility of false positives to a miniscule probability. Any block of data written to the device which starts with the 32 byte, 256 bit, protocol signature pattern (in hexadecimal) below, is examined further.

a67d299f 9a88590b 267285c5 bf58b715 9731ecaf 397c1787 8e7fe317 cc3d956d

In this exemplary embodiment, the signature must be followed by the protocol message pending indicator of 0001.

When the control logic detects this, it turns on the ProtocolRequestPending flag in its internal memory and stores the number of the sector being written as ProtocolSector. When (and if) this same sector is written again—before (1) another such sector is written, and (2) a 10 second timer expires, or the device is disconnected from the host—beginning with the protocol signature followed by the protocol message indicator of 0xffff. This latter sector is treated as a protocol message. The request is acted upon and the ProtocolRequestPending flag is cleared A wide range of possible protocol messages are envisioned. Following are the exemplary commands presented in this embodiment. Each command is up to 512 bytes in length. The structure of each command is as follows:

| | |
|---|---|
| ProtocolSignature | 32 bytes |
| ProtocolIndicator | 2 bytes |
| ProtocolCommand | 1 byte |
| ProtocolData | up to 477 bytes |

| Command | Value | Data Field(s) | Description |
|---|---|---|---|
| SelfTest | 01 | None | Perform a self test diagnostic and display the test results. |
| SetDisplayMessage | 02 | MessageLength 1 byte MessageText 476 bytes | Set the user display message up to the maximum supported by the device, with a design limit of 476 bytes. |
| ResetDevice | 03 | None | Reset the label device. All non-volatile storage is cleared. (This does not effect the storage device) |
| InitializeDeviceData | 04 | SegmentNumber 1 byte SegmentData 476 bytes | Initialize non-volatile storage to specified values. Useful for resetting values after a battery change. Multiple segments are supported. The details are implementation dependent. |

If we postulate the embodiment's display screen as only 20 characters wide, and device is capable of receiving a SetDisplayMessage of 50 characters then it is contemplated that the embodiment would automatically "scroll" this more lengthy data, as it is viewed, a la ticker tape.

Figures 12A, 12B:
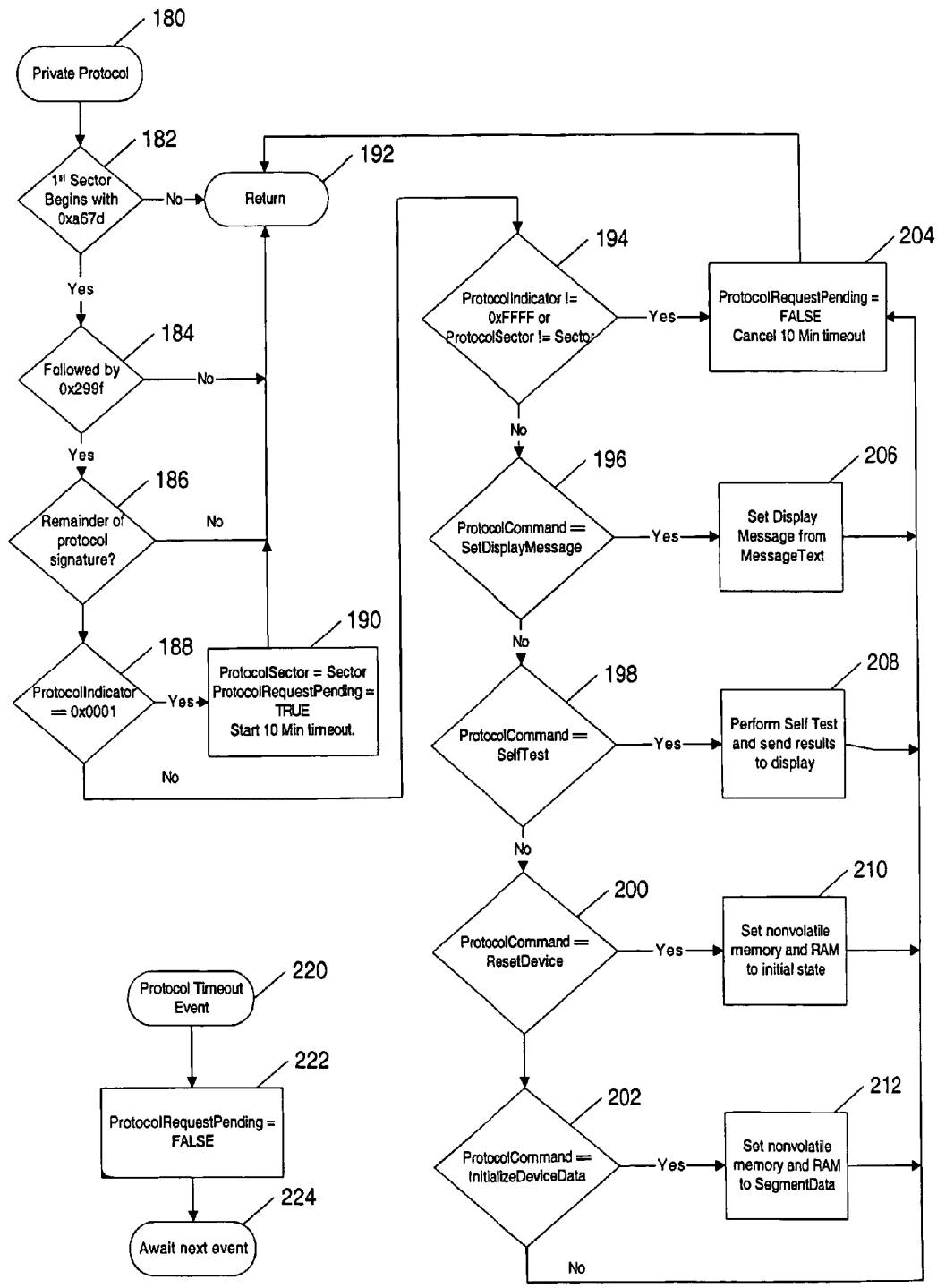
FIG. 12A is a flowchart delineating the sequence of operations involved in generating a custom description for display using a private protocol.
FIG. 12B is a flowchart indicating the sequence of operations performed during protocol timeout processing.

FIG. 12A is a flowchart delineating the sequence of operations involved in generating a custom description for display using the above-described private protocol. As indicated above, the private protocol may be used to display a wide range of messages such as, for example, the name of a company, the name of a person, the person's phone number, or a description of what is on the drive. Through the use of a private protocol, such a user defined message may be generated and updated (without having to add an additional communications channel) through the extended use of a normal read/write mechanism. It is contemplated that other protocols could be used beyond what is disclosed here. In one embodiment a USB device would use the Vendor Specific Request mechanism of the USB 2.0 Specification to provide equivalent functionality.

In accordance with an exemplary embodiment, the private protocol involves performing a write operation to the very first sector of a file, where the data in the write buffer begins with a predetermined signature such as shown above, which is designed to be relatively unique. In an exemplary embodiment, 32 bytes of random information comprise such a signature. The signature should be long enough so that the chance of getting a match on something other than the signature is very small. A check is initially made to determine whether the sector at issue begins the predetermined signature. If there is no match, then the routine exits and no more need be done. The signature must be followed by a protocol indicator of 0x0001, which indicates that a protocol request will be coming. If a write operation is then received with the same signature, followed by protocol indicator of 0xFFFF, a valid protocol request is recognized as being received. The remainder of the sector being written contains the actual protocol request together with the appropriate request data. Two writes are required with slightly different contents to preclude the possibility of accidentally triggering a false positive to activate the protocol logic when it is not intended.

Turning to the flowchart of FIG. 12A, the private protocol logic (180) initially checks to determine whether the first sector begins with the first two bytes (e.g., "0xa67d") of the predetermined signature (182). If so, a check is made to determine whether the next two bytes (e.g., "0x299f") of the signature are present (184). If so, a check is made to determine whether the remainder of the protocol signature is present (186). The checks are done in this manner to allow a low power microcontroller to quickly skip requests that are clearly not protocol requests with minimal overhead.

If the checks at decision blocks 182, 184, 186 are negative, then nothing further takes place and the routine returns to the calling routine (192).

If the remainder of the protocol signature is determined to be present by the check at block at 186, then a check is made to determine whether the protocol indicator is present, which is the value that follows the signature (e.g., "0x0001").

If the protocol indicator is present, then the protocol sector (ProtocolSector) is set to the current sector. A protocol request pending (ProtocolRequestPending) flag is set to true and a ten minute time-out timer is initiated (190). The ten minute timer determines (under circumstances where the first half of what is required to initiate the private protocol has already occurred) that if the second half of what is required to initiate the private protocol is not detected within ten minutes, then the protocol request will be terminated, i.e., will no longer be pending. After the processing at 190, the routine ends by returning to the calling routine (192).

When the next request is processed that contains the protocol signature and a protocol indicator value of hexadecimal value FEFF, the initial private protocol checks at 182, 184 and 186 will be performed again. However, when a check is made as to whether the protocol indicator is hexadecimal 0001, then the check at block 188 will yield a "no" result, and a check will be made (194) to determine whether the protocol indicator is not hexadecimal FFFF or the protocol sector is not the current sector. If the check at block 194 yields a "yes" result, then such a determination indicates that there is not a valid protocol. The protocol request pending (ProtocolRequestPending) flag is set to false and the 10 minute time-out is cancelled (204). After the processing at 204, the routine returns to the calling routine (192).

Alternatively, if the check at 194 reveals the expected hexadecimal FFFF value and the current sector is confirmed as being processed, then a sequence of checks is made to determine which of four protocol commands are being received. In the exemplary embodiment, as explained above, four commands are utilized. However, additional and/or different commands may be utilized in one or more exemplary embodiments.

A check is made at 196 to determine whether the protocol command is a set display message command (SetDisplayMessage). If so, then the display message is set from the message text (206). Through this mechanism, the user may define any desired message, e.g., this drive is owned by John Doe and contains the music of Maurice Ravel.

If the check at block 196 indicates that a protocol command is not set display message command, then a check is made at block 198 to determine whether the protocol command is a self test command (SelfTest) (198). If the command is a self test command, then the device initiates self test operations and sends the results to the display (208).

If the check at 198 is not a self test command, then a check is made to determine whether the command is a reset device command (ResetDevice) (200). If so, then the nonvolatile memory and RAM are set to an initial state (210).

If the check at 200 reveals that the command is not a reset device command, then a check is made to determine whether the protocol command is an initialize command (InitializeDeviceData), which indicates that a utility is being run to reestablish data in the nonvolatile storage, if, for example, the battery failed, or some other occurrence corrupted data in the nonvolatile memory and RAM. If an initialize command is detected at 202, then the nonvolatile memory and RAM are set in accordance with the requirements of the device to eliminate the corrupt data problems (212).

If the check at block 202 reveals that an initialized command was not issued and after the processing at 206, 208, 210 or 212, the routine branches to 204, where the protocol request pending flag is set to false, and the ten minute timeout is cancelled. The private protocol routine then returns to the calling routing (192).

FIG. 12B is a flowchart indicating the sequence of operations performed during the ten minute timeout processing. After the processing at block 190 initiates a ten minute timer and upon the expiration of the ten minutes, the protocol timeout event processing is initiated (220). Thus, if ten minutes expire and the routine has not as yet received the second protocol message, then the protocol request pending flag is set to false (222) and the routine awaits the occurrence of the next event (224).

Fifth Exemplary Embodiment

This embodiment is an even more elaborate flash storage device similar to the Third and Fourth embodiments. In this case however the control logic has access to the entire flash memory. The display can be one, or a few lines, with the additional feature of being able to actually view the directory structure. The device's control button is implemented as a "rocker" button, recognizing up, down, left and right clicks. This allows the user, when the directory panel is showing, to scroll up and down through a directory with respective clicks, and using the right direction click to advance into a nested sub-folder, and the left to retreat back to the parent directory.

In this embodiment, the display logic tracks through the directory information embedded in the storage data, and presents it to the user, on demand, via the display screen.

Sixth Exemplary Embodiment

Figure 1C:
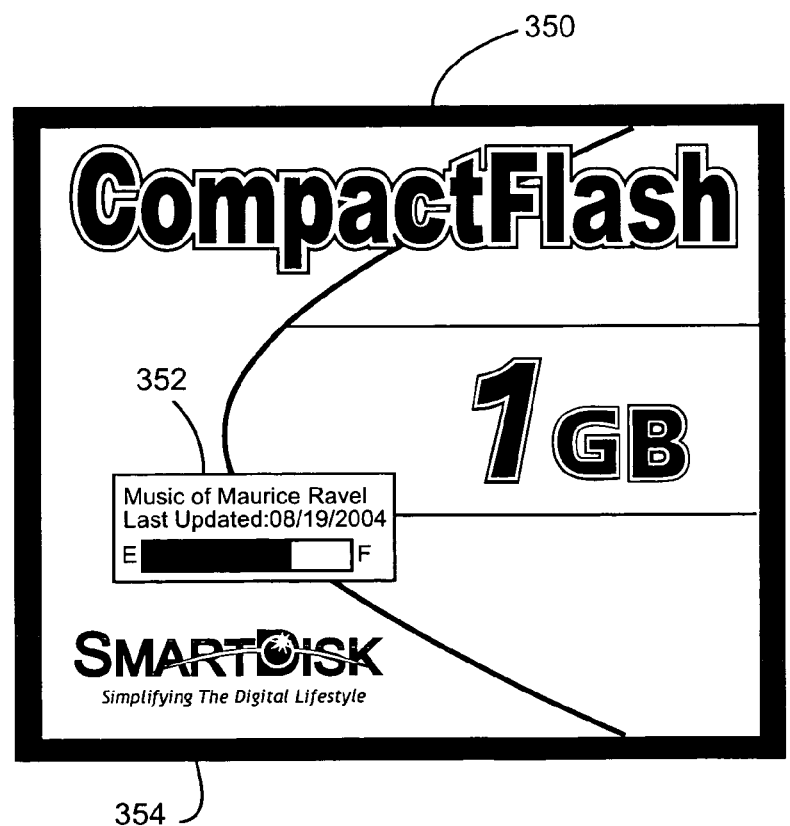
FIG. 1C is an illustrative embodiment of the present invention depicting a CompactFlash having a persistent self-labeling display.

This embodiment is a CompactFlash or Memory Stick module with an integrated, persistent display, the type used by many digital cameras and music players. FIG. 1C illustrates a CompactFlash embodiment 350, with a persistent display 352 containing a user-settable description of the media contents, the date the media was last updated, and a gas gauge indicative of how full the media is. The CompactFlash is connectable to a digital camera, music player or CompactFlash media reader/writer by the CompactFlash interface connector 354. In accordance with this exemplary embodiment, the display contains a 25 character user-settable description field, the date the module was last updated, and a gas gauge-type display used to depict how full the media is at this time. Other indicia for indicating the fullness of the media are also contemplated.

Since, in this embodiment, the media contains a persistent display developed with electronic paper technology similar to that used in the Sony Librie EBR-1000 e-Book, no power is required when the device is offline and the display is thin enough for this application. Other persistent display technologies are also contemplated.

In a typical usage scenario, the user inserts a new CompactFlash into a CompactFlash port on her computer. She accesses her favorite music download software to download an album from her favorite band to the CompactFlash. The music software recognizes this Compact Flash as having an electronic label and automatically sets the descriptive field to contain the album name. This is accomplished using the protocol described in the Fourth Exemplarily Embodiment, or other protocol.

As the user removes the Compact Flash from his/her computer she notes the album name in the descriptive field, today's date in the last update field and the fuel gauge indicating that this media is ¾ full. She places the CompactFlash in her blouse pocket along with three other CompactFlash modules she had previously loaded with other music. Later, she will be able to easily determine the contents of each CompactFlash so that she may select the music she wishes to hear.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A portable hard drive of a size which may be held in the palm of a hand for communicating with a host device comprising:
at least one port configured to communicate with a host device;
a mass storage hard disk;
processing circuitry operatively coupled to said port and said hard disk and configured to calculate information relating to a time of last user write in response to a message indicating the ejection of the hard disk from the host device, the processing circuitry being directly coupled to said port and to said hard disk; and
a display operatively coupled to said processing circuitry and configured to display the calculated information relating to a time of last user write and information relating to the amount of available storage space on the hard disk,
wherein the processing circuitry is configured to calculate information relating to a time of last user write by determining a type of file system storing a file on the hard disk in which the last user write is stored and obtaining time and date information based on the determined type of file system.

2. A portable hard drive according to claim 1, wherein said at least one port is a USB compatible port.

3. A portable hard drive according to claim 1, wherein said at least one port is a FireWire compatible port.

4. A portable hard drive according to claim 1, wherein said display is an LCD display.

5. A portable hard drive according to claim 1, wherein said display is a persistent display which will persist when disconnected from a source of power.

6. A portable hard drive according to claim 1, wherein said processing circuitry is a microcontroller.

7. A portable hard drive according to claim 1, wherein said at least one port comprises a first port which is a USB compatible port and a second port which is a FireWire compatible port.

8. A portable hard drive according to claim 1, further including timing circuitry operatively coupled to said processing circuitry for generating a time-related signal, said processing circuitry for generating a time of access related signal based upon said time-related signal.

9. A portable hard drive according to claim 1, wherein said processing circuitry is operable to generate and couple to said display information identifying the hard drive.

10. A portable hard drive according to claim 1, further including at least one key for a user to input a user-defined message to be displayed.

11. A portable hard drive according to claim 1, further including at least one control key for controlling the display.

12. A portable hard drive of a size which may be held in the palm of a hand for communicating with a host device comprising:
at least one port configured to communicate with a host device;
a mass storage hard disk;
processing circuitry operatively coupled to said port and said hard disk, said processing circuitry configured to calculate information relating to a time of last user write in response to a message indicating the ejection of the hard disk from the host device and to monitor at least part of the contents of a file allocation table on the hard disk drive, the processing circuitry being directly coupled to said port and to said hard disk; and
a display operatively coupled to said processing circuitry and configured to display the calculated information relating to a time of last user write and information obtained by monitoring the file allocation table,
wherein the processing circuitry is configured to calculate information relating to a time of last user write by determining a type of file system storing a file on the hard disk in which the last user write is stored and obtaining time and date information based on the determined type of file system.

13. A portable hard drive according to claim 12, wherein information is accessed from the file allocation table which is functionally related to the total free clusters on the hard disk.

14. A portable hard drive according to claim 12, wherein said display automatically displays information indicative of the total free space on the hard disk.

15. A portable hard drive according to claim 12, further including at least one key for a user to input a user-defined message to be displayed.

16. A portable hard drive according to claim 12, further including at least one control key for controlling the display.

17. A portable hard drive of a size which may be held in the palm of a hand for communicating with a host device comprising:
at least one port configured to communicate with a host device;
a mass storage hard disk;
processing circuitry operatively coupled to said port and said hard disk, said processing circuitry configured to calculate information relating to a time of last user write in response to a message indicating the ejection of the hard disk from the host device and to monitor the master boot record on the hard disk drive, said processing circuitry determining the free space available on the hard disk using the contents of the master boot record, the processing circuitry being directly coupled to said port and to said hard disk; and
a display operatively coupled to said processing circuitry and configured to display the calculated information relating to a time of last user write and information relating to the amount of free space on the hard drive,
wherein the processing circuitry is configured to calculate information relating to a time of last user write by determining a type of file system storing a file on the hard disk in which the last user write is stored and obtaining time and date information based on the determined type of file system.

18. A portable hard drive according to claim 17, wherein said processing circuitry uses information accessed from the master boot record to determine the type of hard drive file system.

19. A portable hard drive according to claim 18, wherein the file system is determined to be FAT 32.

20. A portable hard drive according to claim 17, wherein a file system identifier is accessed from the master boot record.

21. A method of operating a portable hard drive of a size which may be held in the palm of a hand, said portable hard drive including a display comprising:
providing a communication port on said portable hard drive for communicating with a host device;
accessing at least one file system control structure in a mass storage hard disk contained in said hard drive;
determining information related to the amount of free space on said mass storage hard disk based on the content of a file system control structure;
calculating, by processing circuitry, information relating to a time of last user write in response to a message indicating the ejection of the hard disk from the host device, the processing circuitry being directly coupled to said communication port and to said hard drive;
the calculating further calculating information relating to a time of last user write by determining a type of file system storing a file on the hard disk in which the last user write is stored and obtaining time and date information based on the determined type of file system; and
displaying the calculated information relating to a time of last user write and information on said display indicative of the amount of free space on said mass storage device.

22. A method according to claim 21, wherein said accessing step includes the step of accessing a file allocation table (FAT).

23. A method according to claim 21, wherein said accessing step includes the step of accessing a master boot record.

24. A method according to claim 21, further including the step of displaying a user defined message.

25. A method according to claim 21, further including the step of providing at least one key on said portable hard drive.

26. A method according to claim 21, further including the step of automatically updating said display over time.

27. A method according to claim 21, further including the step of displaying the time since the hard drive was last accessed.

28. A method according to claim 21, further including the step of displaying information identifying the hard drive.

29. A method according to claim 21, further including the step of displaying information identifying the owner of the hard drive.

30. A method according to claim 21, further including the step of periodically storing data in a non-volatile memory.

31. A portable hard drive of a size which may be held in the palm of a hand for communicating with a host device comprising:
at least one port configured to communicate with a host device;
a mass storage hard disk;
processing circuitry operatively coupled to said port and said hard disk and configured to calculate information relating to a time of last user write in response to a message indicating the ejection of the hard disk from the host device, the processing circuitry being directly coupled to said port and to said hard disk; and
a display operatively coupled to said processing circuitry and configured to display the calculated information relating to a time of last user write and information relating to the state of the hard drive,
wherein the processing circuitry is configured to calculate information relating to a time of last user write by determining a type of file system storing a file on the hard disk in which the last user write is stored and obtaining time and date information based on the determined type of file system.

32. A portable hard drive according to claim 31, wherein said display is a persistent display which will persist when disconnected from a source of power.

33. A portable hard drive according to claim 31, wherein said display displays error information.

34. A portable hard drive according to claim 31, wherein said display displays defective sector information.

35. A portable hard drive according to claim 31, wherein said display displays fragmentation information.

36. A portable hard drive according to claim 31, wherein said display displays drive internal temperature.

37. A portable hard drive of a size which may be held in the palm of a hand for communicating with a host device comprising:
at least one port configured to communicate with a host device;
a mass storage hard disk;
processing circuitry operatively coupled to said port and said hard disk and configured to calculate information relating to a time of last user write in response to a message indicating the ejection of the hard disk from the host device;

a display operatively coupled to said processing circuitry and configured to display the calculated information relating to a time of last user write and information relating to the amount of available storage space on the hard disk; and at least one key for a user to input a user-defined message to be displayed.

38. A portable hard drive of a size which may be held in the palm of a hand for communicating with a host device comprising:

at least one port configured to communicate with a host device;

a mass storage hard disk;

processing circuitry operatively coupled to said port and said hard disk, said processing circuitry configured to calculate information relating to a time of last user write in response to a message indicating the ejection of the hard disk from the host device and to monitor at least part of the contents of a file allocation table on the hard disk drive;

a display operatively coupled to said processing circuitry and configured to display the calculated information relating to a time of last user write and information obtained by monitoring the file allocation table; and at least one key for a user to input a user-defined message to be displayed.

* * * * *